US006922351B2

(12) United States Patent
Natori et al.

(10) Patent No.: US 6,922,351 B2
(45) Date of Patent: Jul. 26, 2005

(54) FERROELECTRIC MEMORY DEVICE AND METHOD OF MANUFACTURING THE SAME

(75) Inventors: Eiji Natori, Chino (JP); Takeshi Kijima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/426,635

(22) Filed: May 1, 2003

(65) Prior Publication Data

US 2003/0227803 A1 Dec. 11, 2003

Related U.S. Application Data

(63) Continuation of application No. PCT/JP02/09032, filed on Sep. 5, 2002.

(30) Foreign Application Priority Data

Sep. 5, 2001 (JP) ........................................ 2001-269542

(51) Int. Cl.[7] ................................................ G11C 7/00
(52) U.S. Cl. ....................................... 365/145; 365/149
(58) Field of Search ................................ 365/145, 149, 365/117

(56) References Cited

U.S. PATENT DOCUMENTS

| 5,481,490 | A | * | 1/1996 | Watanabe et al. ........... 365/145 |
| 6,194,228 | B1 | | 2/2001 | Fujiki et al. |
| 6,301,145 | B1 | * | 10/2001 | Nishihara .................... 365/145 |
| 6,344,991 | B1 | * | 2/2002 | Mikami et al. .............. 365/145 |
| 6,611,448 | B2 | * | 8/2003 | Nair et al. ................... 365/145 |

FOREIGN PATENT DOCUMENTS

| EP | 1 039 525 A1 | 9/2000 |
| JP | A 8-340086 | 12/1996 |
| JP | A 9-116107 | 5/1997 |
| JP | A 2001-181034 | 7/2001 |
| WO | WO 02/32809 A1 | 4/2002 |

OTHER PUBLICATIONS

Extended Abstracts (The 48th Spring Meeting, 2001); The Japan Society of Applied Physics and Related Societies, Mar. 28, 2001, p. 535.

Xusheng Wang et al., "Structural and Electrical Properties of Ferroelectric $Pb(Zr_{1-x}Ti_x)O_3$–$SiO_2$ Glass–Ceramic Thin Films Derived by the Sol–Gel Method," Japanese Journal of Applied Physics, vol. 40, Part 1, No. 3A, Mar. 2001, pp. 1401–1407.

Xusheng Wang et al., "Sol–Gel Derived Ferroelectric $Pb(Zr_{1-x}Ti_x)O_3$–$SiO_2$–$B_2O_3$ Glass–Ceramic Thin Films Formed at Relatively Low Annealing Temperatures," Japanese Journal of Applied Physics, vol. 40, Part 1, No. 9B, Sep. 2001, pp. 5547–5550.

Takeshi Kijima et al., "Preparation of $Bi_4Ti_3O_{12}$ Thin Films on Si(100) Substrate Using $Bi_2SiO_5$ Buffer Layer and its Electric Characterization," Japanese Journal of Applied Physics, vol. 37, Part 1, No. 9B, Sep. 1998, pp. 5171–5173.

\* cited by examiner

*Primary Examiner*—Vu A. Le
(74) *Attorney, Agent, or Firm*—Oliff & Berridge, PLC

(57) ABSTRACT

A ferroelectric memory device includes first electrodes, second electrodes arranged in a direction which intersects the first electrodes, and ferroelectric films disposed in at least intersecting regions of the first electrodes and the second electrodes. Capacitors formed of the first electrodes, the ferroelectric films, and the second electrodes are disposed in a matrix. A ferroelectric phase and a paraelectric phase are mixed in each of the ferroelectric films.

34 Claims, 23 Drawing Sheets

R=0.1

R=0

10nm

FERROELECTRIC MEMORY DEVICE AND METHOD OF MANUFACTURING THE SAME

CROSS REFERENCE TO THE RELATED APPLICATIONS

This application is a continuation of International Patent Application No. PCT/JP02/09032, having an international filing date of Sep. 5, 2002 which designated the United States, the entirety of which is incorporated herein by reference. Japanese Patent Application No. 2001-269542 filed on Sep. 5, 2001 is also incorporated herein by reference in its entirety.

BACKGROUND OF THE INVENTION

The present invention relates to a ferroelectric memory device formed by using ferroelectric capacitors. More particularly, the present invention relates to a simple matrix type ferroelectric memory device having no cell transistor and including memory cells formed only by ferroelectric capacitors, and a method for manufacturing the same.

In recent years, research and development of thin films such as PZT and SBT, ferroelectric capacitors using these thin films, ferroelectric memory devices, and the like have been extensively conducted. The structure of ferroelectric memory devices is roughly divided into a 1T, 1T1C, 2T2C, and a simple matrix type. A 1T type ferroelectric memory device has a retention (data retention) as short as one month since an internal electric field inevitably occurs in the capacitor. Therefore, it is considered to be impossible to ensure a 10-year guarantee generally required for semiconductors. A simple matrix type ferroelectric memory device has a cell size smaller than that of the 1T1C type and 2T2C type ferroelectric memory devices and allows multilayering of capacitors. Therefore, an increase in the degree of integration and reduction of cost are expected by using a simple matrix type ferroelectric memory device.

Conventional simple matrix type ferroelectric memory devices are disclosed in Japanese Patent Application Laid-open No. 9-116107 and the like. Japanese Patent Application Laid-open No. 9-116107 discloses a drive method in which a voltage one-third of a write voltage is applied to nonselected memory cells when writing data into the memory cells. However, this technology does not provide detailed description relating to hysteresis loop characteristics of the ferroelectric capacitor necessary for the operation. The present inventors have conducted studies and found that a hysteresis loop having good squareness is indispensable to obtain a simple matrix type ferroelectric memory device which can be operated in practice.

BRIEF SUMMARY OF THE INVENTION

The present invention may provide a simple matrix type ferroelectric memory device including a ferroelectric capacitor having hysteresis loop characteristics which enable a simple matrix type ferroelectric memory device to be operated in practice, and a method of manufacturing the same.

A ferroelectric memory device according to the present invention comprises first electrodes, second electrodes arranged in a direction which intersects the first electrodes, ferroelectric films disposed in at least intersecting regions of the first electrodes and the second electrodes, capacitors formed by the first electrodes, the ferroelectric films, and the second electrodes being disposed in a matrix, wherein each of the ferroelectric films includes a ferroelectric phase and a paraelectric phase in a mixed state.

A method of manufacturing the ferroelectric memory device according to the present invention comprises a step of crystallizing a ceramic raw material liquid including a first raw material liquid and a second raw material liquid, the first raw material liquid being a raw material liquid for forming a ferroelectric phase, and the second raw material liquid being a raw material liquid for forming a paraelectric phase.

A ferroelectric memory device according to the present invention comprises first electrodes, second electrodes arranged in a direction which intersects the first electrodes, ferroelectric films disposed in at least intersecting regions of the first electrodes and the second electrodes, capacitors formed by the first electrodes, the ferroelectric films, and the second electrodes being disposed in a matrix, wherein each of the ferroelectric films includes at least one of Si and Ge.

BRIEF DESCRIPTION OF THE SEVERAL VIEWS OF THE DRAWING

FIGS. 3A and 3B are views showing a structure of a ferroelectric memory device in an embodiment of the present invention in which memory cells are arranged in a simple matrix, wherein FIG. 3A is a plan view and FIG. 3B is a cross-sectional view.

DETAILED DESCRIPTION OF THE EMBODIMENT

Figure 1:
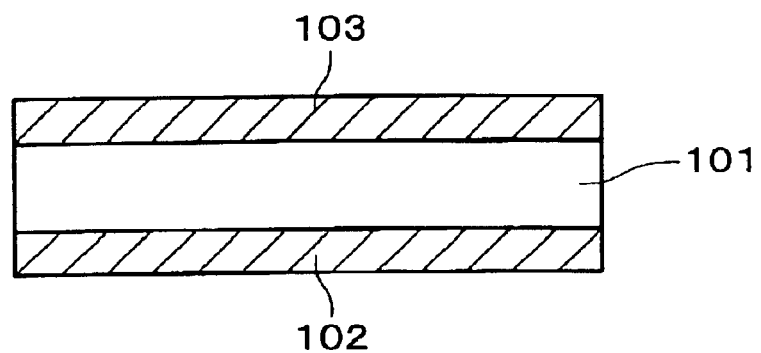
FIG. 1 is a view showing a structure of a ferroelectric capacitor in an embodiment of the present invention.

A ferroelectric memory device according to an embodiment of the present invention comprises first electrodes, second electrodes arranged in a direction which intersects the first electrodes, ferroelectric films disposed in at least intersecting regions of the first electrodes and the second electrodes, capacitors formed by the first electrodes, the ferroelectric films, and the second electrodes being disposed in a matrix, wherein each of the ferroelectric films includes a ferroelectric phase and a paraelectric phase in a mixed state.

In order to obtain hysteresis having good squareness, it is important to prevent occurrence of 90° domains. According to the present embodiment, pressure can be applied to the ferroelectric phase in the direction of the surface of the film by allowing the ferroelectric film to include the ferroelectric phase and the paraelectric phase having different crystal growth mechanisms in a mixed state, whereby occurrence of 90° domains can be prevented. In particular, a PZT (PbZrTiO) based Bravais lattice is body-centered cubic at the crystallization temperature and changed to tetragonal in the cooling process. Therefore, 180° domains are easily formed by applying pressure in the direction of the surface of the film in the cooling process, whereby squareness of the hysteresis is improved. According to the present embodiment, since surface morphology of the ferroelectric film is improved due to an increase in density, process damage (hydrogen damage during formation of an interlayer dielectric formed of $SiO_2$ or a passivation film, for example) which causes deterioration of hysteresis characteristics can be prevented. In the present embodiment, occurrence of 90° domains can be further prevented by continuously forming the ferroelectric phase in the thickness direction of the film and dispersing the ferroelectric phase and the paraelectric phase in the surface direction of the film.

The embodiment of the present invention may have any of the following features.

(A) The ferroelectric phase may include a PZT-based ferroelectric, and the paraelectric phase may include a paraelectric shown by $ABO_x$ or $BO_x$ which includes at least one of Ge and Si in a B site.

An oxide in which the B site of the paraelectric shown by $ABO_x$ is Ge and/or Si has a low melting point of about 710° C. Therefore, crystal nuclei can be formed at a temperature lower than that in the case of using only a ferroelectric by using such an oxide. As a result, crystal growth of the ferroelectric can be controlled by adjusting the heat treatment conditions. According to this feature, a ferroelectric film having hysteresis with good squareness and having a high degree of crystal orientation can be obtained. Moreover, the crystallization temperature of the entire ferroelectric film can be decreased. A decrease in process temperature prevents variation of elements which are easily volatilized such as Pb and Bi which are constituent elements of the ferroelectric, thereby preventing occurrence of lattice defects. Squareness of the hysteresis is improved by preventing occurrence of defects by domain pinning.

The paraelectric shown by $ABO_x$ may include at least one of Pb, Hf, Zr, V, and W in an A site.

The A site of the paraelectric $ABO_x$ is preferably the same element as the constituent element of the ferroelectric so that the influence is small even if the site of the ferroelectric is replaced. As examples of the A site element, Pb, Hf, Zr, V, and W can be given. Since the paraelectric having these elements has an effect of preventing oxygen vacancy even if some of the elements of the ferroelectric are replaced, process margin of the material can be increased, whereby hysteresis having good reproducibility and stability can be obtained.

As examples of PZT-based ferroelectrics, PbZrTiO-based ferroelectrics ($PbZr_yTi_{1-y}O_3$, for example) and PbLaZrTiO-based ferroelectrics ($Pb_{1-x}La_xZr_yTi_{1-y}O_3$, for example) can be given.

As examples of paraelectrics shown by $ABO_x$ in which the B site consists of at least one of Ge and Si and the A site consists of at least one of Pb, Hf, Zr, V, and W, PbGeO ($Pb_5Ge_3O_x$ and $Pb_2Ge_1O_x$), PbSiO ($Pb_5Si_3O_x$ and $Pb_2Si_1O_x$), $ZrGeO_x$, $HfGeO_x$, $VGeO_x$, $WGeO_x$, $VSiO_x$, $WSiO_x$, and the like can be given. In the case of using the paraelectric having Pb, Zr, Hf, V, or W in the A site, oxygen vacancy of the ferroelectric is prevented.

As examples of paraelectrics shown by $BO_x$ in which the B site is at least one of Ge and Si, GeOx, SiOx, GeSiOx, and the like can be given. These paraelectrics may also be used in the case of (B) described below.

(B) The ferroelectric phase may include a layered perovskite ferroelectric, and the paraelectric phase may include a paraelectric shown by $ABO_x$ or $BO_x$ which includes at least one of Ge and Si in a B site.

The paraelectric shown by $ABO_x$ may include at least one of Bi, Hf, Zr, V, and W in an A site. These elements are preferably the same elements as the constituent elements of the ferroelectric so that the influence is small even if the site of the ferroelectric is replaced in the same manner as in the case of (A). In particular, since a Bi layered perovskite has better characteristics when Bi is in excess of the stoichiometric composition to only a small extent, the A site is preferably Bi.

The paraelectric shown by $ABO_x$ may include at least one of Ca, Sr, Ln (Ln is the abbreviation for lanthanoid, Ln: La, Ce, Pr, Nd, Sm, Eu, Gd, Tb, Dy, Ho, Er, Yb, and Lu), Nb, Mn, and Pb in an A site.

As examples of layered perovskite ferroelectrics, SrBiTaO-based ferroelectrics ($SrBi_2Ta_2O_9$, for example), BiLaTiO-based ferroelectrics ($Bi_{3.25}La_{0.75}Ti_3O_{12}$, for example), BiTiO-based ferroelectrics ($Bi_4Ti_3O_{12}$, for example), BiWO-based ferroelectrics ($Bi_2WO_6$, for example), BiMoO-based ferroelectrics ($Bi_2MoO_6$, for example), and the like can be given.

As paraelectrics shown by $ABO_x$ in which the B site is at least one of Ge and Si and the A site is at least one of Hf, Zr, V, and W, the above-mentioned paraelectrics may be used. As examples of paraelectrics shown by $ABO_x$ in which the B site is at least one of Ge and Si and the A site is Bi, BiGeO ($Bi_4Ge_3O_x$ and $Bi_2Ge_1O_x$) and BiSiO ($Bi_4Si_3O_x$) can be given.

As examples of paraelectrics shown by $ABO_x$ in which the B site is at least one of Ge and Si and the A site is at least one of Ca, Sr, Ln (in particular, La, Nd, and Sm have a significant effect of improving single orientation of crystals) Nb, Mn, and Pb, $CaSiO_3$, $SrSiO_3$, $NbSiO_4$, $MnSiO_4$, $PbSiO_4$, and the like can be given. These paraelectrics may also be applied to the case where the paraelectrics are used in combination with the PZT-based ferroelectric described in (A).

(C) The ferroelectric phase may include a tungsten-bronze type ferroelectric, and the paraelectric phase may include a paraelectric shown by $ABO_x$ or $BO_x$ which includes at least one of Ge and Si in a B site.

(D) The ferroelectric preferably has a crystal structure given below in order to obtain hysteresis having good squareness.

The PZT-based ferroelectric may have a (111) preferred oriented tetragonal structure. The PZT-based ferroelectric may have a (100) preferred oriented rhombohedral structure.

The layered perovskite ferroelectric may be a (115) preferred oriented SBT. The layered perovskite ferroelectric may be a (117) preferred oriented BIT.

(E) A material for the ferroelectric film may be a mixed material which includes a ferroelectric material and a paraelectric material including at least one of a silicate and a germanate having a relative dielectric constant lower than that of the ferroelectric. The relative dielectric constant of the ferroelectric film can be decreased by mixing the ferroelectric material with the paraelectric material having a relative dielectric constant lower than that of the ferroelectric material, whereby squareness of the hysteresis can be further improved.

(F) A molar ratio of a material B for the paraelectric to a material A for the ferroelectric may be 0.1≦material B/material A≦9. A solid-solution state of the ferroelectric film can be controlled by setting 0.1≦material B/material A≦1, or 1<material B/material A≦9.

A method of manufacturing the ferroelectric memory device according to the present embodiment comprises a step of crystallizing a ceramic raw material liquid including a first raw material liquid and a second raw material liquid, the first raw material liquid being a raw material liquid for forming a ferroelectric phase, and the second raw material liquid being a raw material liquid for forming a paraelectric phase.

The ferroelectric film which makes up the capacitor may be formed by using sputtering or MOCVD (Metalorganic Chemical Vapor Deposition). However, these methods hinder crystal growth control because internal stress occurs in the film during deposition before crystallization. Moreover, since these methods allow a dense film to be formed before annealing for crystallization, migration of the elements during crystal growth is poor. Therefore, since the crystallization temperature is increased and oxygen is introduced with difficulty, oxygen vacancy easily occurs. Therefore, it is preferable to use a liquid raw material such as in the case of sol-gel and MOD (Metal Organic Decomposition) in the manufacturing method of the present embodiment.

The manufacturing method of the embodiment of the present invention may have any of the following features.

(a) The ceramic raw material liquid may-be formed by mixing the first raw material liquid with the second raw material liquid at a ratio from 100:400 to 100:900 in a liquid state. This ratio is preferable in the case of using a layered perovskite ferroelectric, for example.

A ceramic raw material in which the ferroelectric material and the paraelectric material are micro-dispersed can be obtained by mixing the first raw material liquid with the second raw material liquid in this manner. The ferroelectric can be continuously formed in the direction of the thickness of the film and the ferroelectric phase and the paraelectric phase can be dispersed in the direction of the surface of the film by making the amount of paraelectric material greater than the amount of ferroelectric material by setting the ratio of the first raw material liquid (ferroelectric material) to the second raw material liquid (paraelectric material) within the above range. If the ratio of the paraelectric material to the ferroelectric material is greater than the above range, polarization may be decreased.

(b) The first raw material liquid and the second raw material liquid may be applied in the form of a mist by using LSMCD (Liquid Source Misted Chemical Deposition) or the like. This technique easily enables the ferroelectric phase and the paraelectric phase to be dispersed in comparison with a method of applying a liquid ceramic raw material using spin coating or dipping.

(c) After applying the ceramic raw material liquid on first electrodes, ferroelectric films may be formed by crystallizing the ceramic raw material liquid by rapid thermal annealing, second electrodes may be formed on the ferroelectric films, and annealing may be performed in a pressurized atmosphere containing oxygen.

It is desirable to perform crystallization by rapid thermal annealing (hereinafter called "RTA") in order to cause the ferroelectric phase and the paraelectric phase to be mixed in the ferroelectric film. In the formation of a capacitor using a material in which a ferroelectric material is mixed with a paraelectric material, crystal growth of the ferroelectric is promoted by the addition of the paraelectric material. However, since this method also promotes growth of different phases (pyrochlore and fluorite) which are formed at a temperature lower than the formation temperature of the ferroelectric crystals, it is preferable to rapidly increase the temperature to the formation temperature of the ferroelectric crystals. In the case of using FA (furnace annealing), although a ferroelectric is always formed using only a ferroelectric composition even if different phases are present, a ferroelectric is rarely formed if a paraelectric is added. Moreover, the degree of orientation of the crystals is improved by using RTA. It is estimated that this is because a rapid temperature gradient occurs in the direction of the thickness of the film in the initial stage of crystallization.

Since the thickness of a defective section due to oxygen vacancy at the interface between the ferroelectric film and the electrode (screening length) can be decreased by performing annealing after crystallization in a pressurized atmosphere higher than atmospheric pressure after forming the second electrode, the thickness of the film can be decreased. Delamination of the film can be prevented by decreasing the thickness of the ferroelectric film.

According to the present embodiment, a simple matrix type ferroelectric memory device in which a peripheral circuit and a memory cell array are integrated on a single substrate can be realized with high reproducibility and stability.

A ferroelectric memory device according to the present embodiment comprises first electrodes, second electrodes arranged in a direction which intersects the first electrodes, ferroelectric films disposed in at least intersecting regions of the first electrodes and the second electrodes, capacitors formed by the first electrodes, the ferroelectric films, and the second electrodes being disposed in a matrix, wherein each of the ferroelectric films includes at least one of Si and Ge.

The ferroelectric film is typically a complex oxide having an oxygen octahedral structure, and has at least one of Si and Ge, and preferably both Si and Ge in the oxygen octahedral structure. The ceramics of the present embodiment may be referred to as ceramics in which a paraelectric including at least one of Si and Ge, and preferably both Si and Ge is dissolved in a complex oxide having an oxygen octahedral structure. Si and Ge included in such an oxygen octahedral structure have a coordination number of six. The ferroelectric film of the present embodiment has extremely good hysteresis characteristics such as good squareness. Moreover, the crystallization temperature of the ferroelectric film can be significantly decreased in comparison with a conventional film.

In the ceramics of the present embodiment, a metal cation (B site ion) positioned in the oxygen octahedral structure of the complex oxide is replaced with at least one of an Si ion and a Ge ion. For example, a $(Bi,La)_4(Ti,Si,Ge)_3O_{12}$ ferroelectric according to the present invention is obtained by replacing the B site ions with $Si^{4+}$ and $Ge^{4+}$. $(Bi,La)_4(Ti,Si,Ge)_3O_{12}$ cannot be easily known from the analogy to $Bi_4Ti_3O_{12}$. Specifically, $Si^{4+}$ and $Ge^{4+}$ have strong covalent bonding properties and are not metal elements. Moreover, it is a common practice to replace an element which makes up a perovskite with an ion having an ionic radius close to that of the element. However, $Si^{4+}$ has an ionic radius of 0.26 angstrom, which is considerably smaller than the ionic radius of $Ti^{4+}$ (0.6 angstrom). Therefore, it is difficult to consider replacing the B site ions with $Si^{4+}$ and $Ge^{4+}$. Therefore, the ferroelectric of the present embodiment completely differs from a conventional ferroelectric material.

A ferroelectric containing both Si and Ge has the following advantages. Specifically, formation of the ceramics of the present invention is remarkably facilitated by replacing a part of the B site of the oxygen octahedron with Si and Ge. Ge has an ionic radius which is greater than that of Si and is close to the lattice spacing of the B site. Therefore, Ge has a remarkably high capability of replacing the B site of the oxygen octahedron in comparison with Si. Since the entire lattice of the oxygen octahedron shrinks or is distorted when Ge enters the B site of the oxygen octahedron, Si easily replaces the B site. Covalent bonding properties can be sufficiently introduced into the oxygen octahedron by using Si and Ge in combination in comparison with the case of using only Ge, whereby catalytic functions of the paraelectric can be further increased.

This ferroelectric memory device may have any of the following features.

(A) A material for the ferroelectric film may be a mixed material which includes a ferroelectric material and a paraelectric material including at least one of a silicate and a germanate having a relative dielectric constant lower than that of the ferroelectric. Since the advantages of this feature are described above, further description is omitted.

(B) The paraelectric material may include at least one of:
at least one layered compound having an oxygen tetrahedral structure selected from a group consisting of $CaSiO_3$, $BaSiO_3$, $PbSiO_3$, $ZnSiO_3$, $MgSiO_3$, $B_2SiO_5$, $Al_2SiO_5$, $Y_2SiO_5$, $La_2SiO_5$, $Cr_2SiO_5$, $Bi_2SiO_5$, $Ga_2SiO_5$, $ZrSiO_4$, $TiSiO_4$, $HfSiO_4$, $NbSiO_4$, $MoSiO_5$, $WSiO_5$, and $V_2SiO_7$, and
at least one layered compound having an oxygen tetrahedral structure selected from a group consisting of $CaGeO_3$, $BaGeO_3$, $PbGeO_3$, $ZnGeO_3$, $MgGeO_3$, $B_2GeO_5$, $Al_2GeO_5$, $Y_2GeO_5$, $La_2GeO_5$, $Cr_2GeO_5$, $Bi_2GeO_5$, $Ga_2GeO_5$, $ZrGeO_4$, $TiGeO_4$, $HfGeO_4$, $NbGeO_4$, $MoGeO_5$, $WGeO_5$, and $V_2GeO_7$.

(C) A molar ratio of the paraelectric material to the ferroelectric material may be $0.1 \leq$ paraelectric material/ferroelectric material $\leq 9$. Hysteresis characteristics, imprint and retention characteristics, and hydrogen resistance of a layered perovskite ferroelectric can be increased by setting the ratio within this range, for example. Moreover, the state of the ferroelectric film such as a solid-solution state and a layer structure can be controlled by selecting the above ratio, for example. For example, if the molar ratio is set to $0.1 \leq$ paraelectric material/ferroelectric material $\leq 1$, the ferroelectric and the paraelectric form a solid solution. If the molar ratio is set to $1<$ paraelectric material/ferroelectric material $\leq 9$, a ferroelectric film in which a solid solution of the ferroelectric and the paraelectric coexists with a column-shaped paraelectric phase can be obtained.

The present embodiment is described below in more detail.

1. Capacitor of Ferroelectric Memory Device

FIG. 1 is a view showing a ferroelectric capacitor of the ferroelectric memory device of the present embodiment. In FIG. 1, 101 indicates a ferroelectric film which includes a ferroelectric phase and a paraelectric phase in a mixed state (hereinafter may be called "mixed thin film"), 102 indicates a first electrode, and 103 indicates a second electrode. The mixed thin film 101 is formed by a ferroelectric phase consisting of PZT or SBT and a paraelectric phase consisting of an $ABO_x$ type oxide or a $BO_x$ type oxide, for example. The first electrode 102 and the second electrode 103 are formed of a noble metal element such as Pt, Ir, or Ru, or a composite material containing the noble metal as a major component. If the elements of the ferroelectric are diffused into the first electrode, squareness of hysteresis is decreased due to variation of the composition at the interface between the electrode and the ferroelectric film. Therefore, the first electrode must have a density which does not allow the elements of the ferroelectric to be diffused into the first electrode. In order to increase the density of the first electrode, a method of depositing the first electrode by sputtering using a large mass of gas, or a method of dispersing an oxide of Y, La, or the like into the noble metal electrode is employed, for example. In FIG. 1, a substrate and other constituent elements (MOS transistors and the like) of the ferroelectric memory device are omitted. These constituent elements are described later.

An example of a deposition method for the mixed thin film 101 is described below.

A first raw material liquid is a solution in which a metal compound or a metal inorganic compound of the constituent metal elements of the ferroelectric phase is dissolved in a solvent. A second raw material liquid is a solution in which a metal compound or a metal inorganic compound of the constituent metal elements of the $ABO_x$ type oxide or the $BO_x$ type oxide is dissolved in a solvent. A ceramic raw material liquid is formed by mixing the first raw material liquid with the second raw material liquid. The range of the volume mixing ratio of the first raw material liquid to the second raw material liquid is 100:400 to 100:900.

Figure 5:
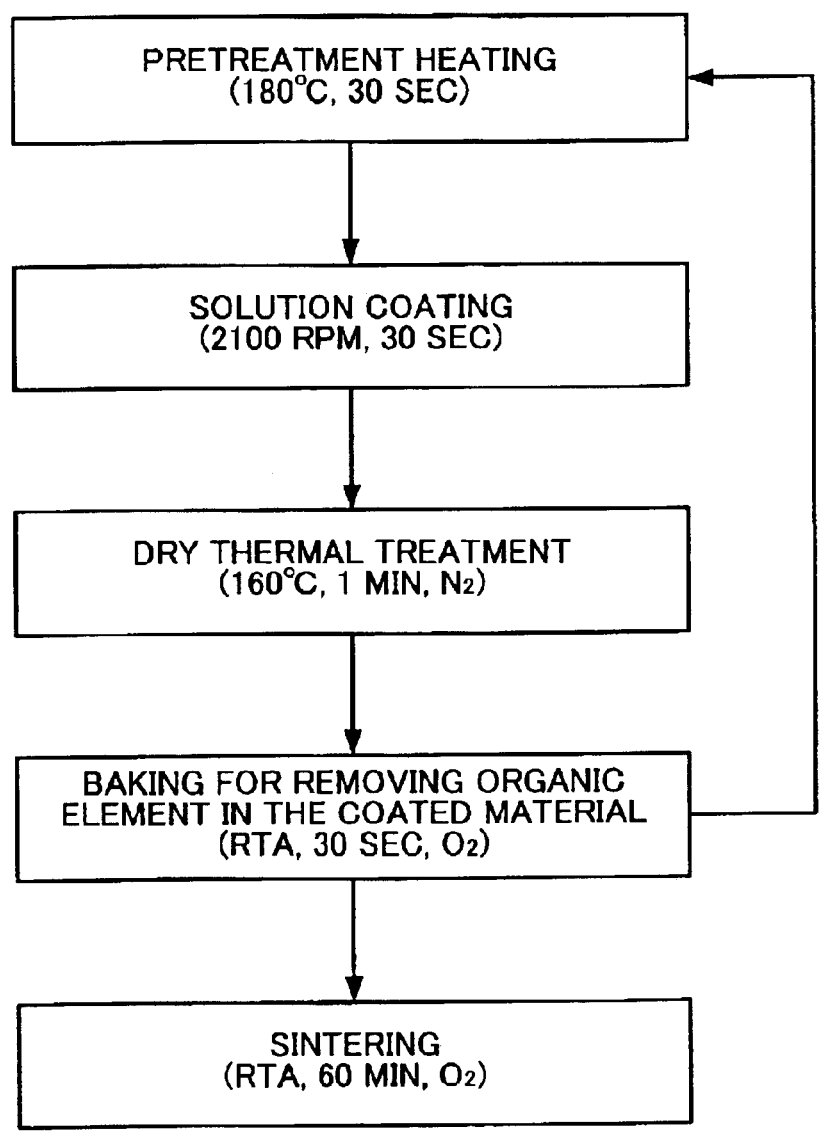
FIG. 5 is a flowchart of a deposition process in an embodiment of the present invention.

The mixed liquid of these raw material liquids is deposited according to a flowchart shown in FIG. 5. In more detail, after repeating a series of steps consisting of a pretreatment heating step, a solution coating step, a dry thermal treatment step, a cleaning thermal treatment step, and a baking step a desired number of times, the baked product is sintered to form a ferroelectric film. Examples of deposition conditions are given below. The pretreatment heating step is performed at 150 to 180° C. The mixed liquid is applied by using a coating method such as spin coating. The dry thermal treatment is performed at 150 to 180° C. in a nitrogen atmosphere. The baking (cleaning thermal treatment) step is performed by using RTA at 250 to 280° C. in an oxygen atmosphere. The sintering (crystallization) step is performed by using RTA at 425 to 650° C. in an oxygen atmosphere. The crystallization temperature in a conventional technique in which a paraelectric is not mixed is 700 to 800° C., which is higher than the crystallization temperature of the present embodiment. The thickness of the film after sintering is 15 to 200 nm. After forming the second electrode by sputtering, annealing is performed preferably in a pressurized atmosphere (mixed gas of argon and oxygen at 2 to 9.9 atm, for example) to obtain a ferroelectric capacitor.

Figure 2:
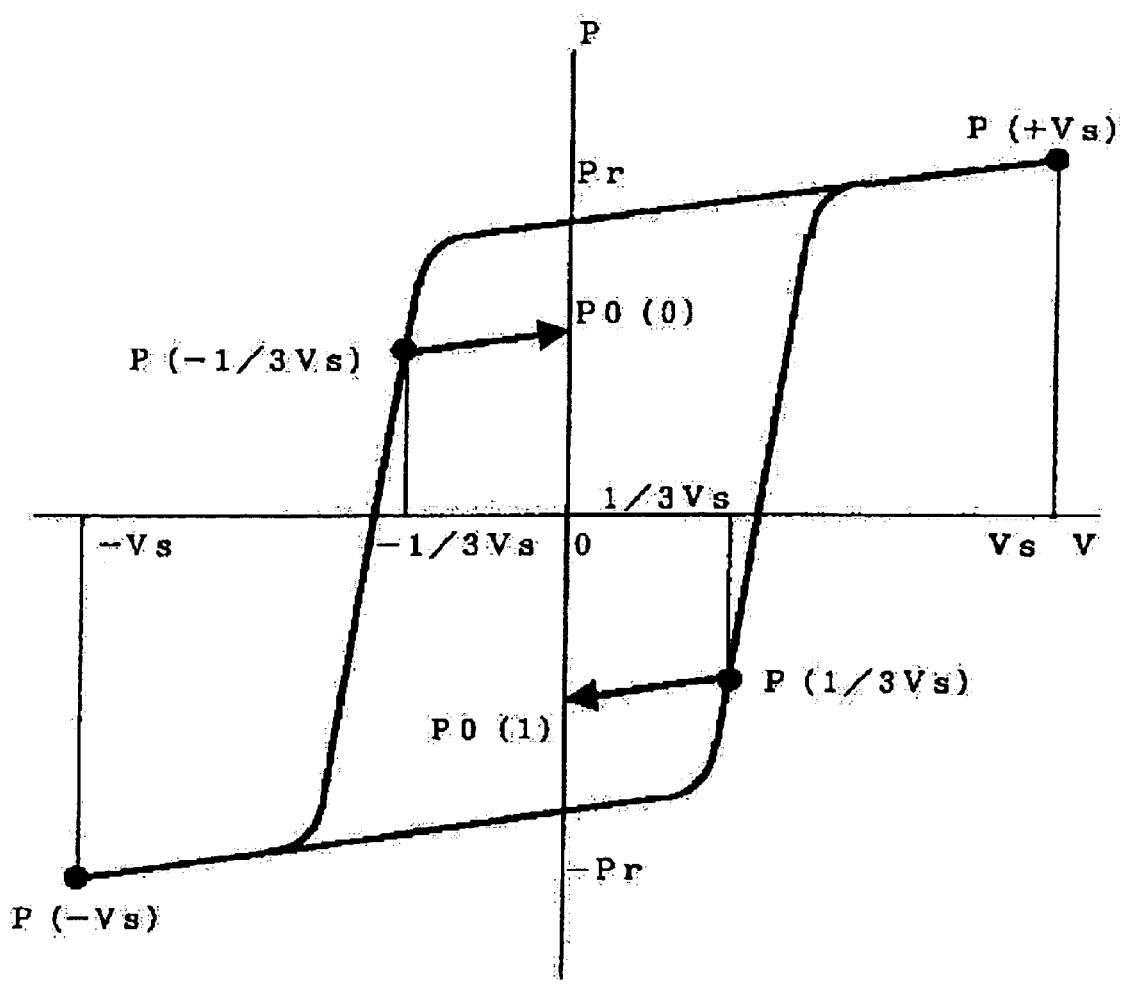
FIG. 2 is a view showing a P (polarization) –V (voltage) hysteresis curve of the ferroelectric capacitor in an embodiment of the present invention.

FIG. 2 is a view schematically showing a P (polarization) –V (voltage) hysteresis curve of the ferroelectric capacitor used in the present embodiment. This ferroelectric capacitor has a hysteresis curve in which the polarization is P(+Vs) at an applied a voltage of +Vs, Pr at an applied voltage of 0, P(−⅓Vs) at an applied voltage of −⅓Vs, P(−Vs) at an applied voltage of −Vs, −Pr when the voltage is returned to 0, P(+⅓Vs) at an applied voltage of +⅓Vs, and P(+Vs) when the voltage is returned to +Vs.

The present inventors have found the following characteristics of the ferroelectric capacitor used in the present embodiment. Specifically, after applying a voltage of Vs (polarization P(+Vs)), a voltage of −⅓Vs is applied and the applied voltage is then changed to 0. In this case, the hysteresis loop follows a locus indicated by an arrow shown in FIG. 2 and the polarization has a stable value of P0 (0). After applying a voltage of −Vs (polarization P (−Vs)), a voltage of +⅓Vs is applied and the applied voltage is then changed to 0. In this case, the hysteresis loop follows a locus indicated by an arrow shown in FIG. 2 and the polarization has a stable value of P0 (1).

If the difference between the polarization P0 (0) and the polarization P0 (1) is sufficiently secured, a simple matrix type ferroelectric memory device can be operated by using the drive method disclosed in Japanese Patent Application Laid-open No. 9-116107 or the like.

According to the above ferroelectric capacitor, a decrease in crystallization temperature, an increase in squareness of the hysteresis, and an increase in Pr can be achieved. A simple matrix type ferroelectric memory device having such a ferroelectric capacitor can be driven. An increase in squareness of the hysteresis of the ferroelectric capacitor has significant effects on stability against disturbance, which is important for driving the simple matrix type ferroelectric memory device. In the simple matrix type ferroelectric memory device, since a voltage of ±⅓Vs is applied to the cells in which neither writing nor reading is performed, the polarization must not be changed at this voltage, specifically, disturbance characteristics must be stable. The present inventors have confirmed that the polarization of conventional SBT is decreased by 30 to 50% when a ⅓Vs pulse is applied $10^{10}$ times in the direction in which the polarization is reversed from a stable state, and the amount of decrease is 10% or less according to the present invention.

Figure 6:
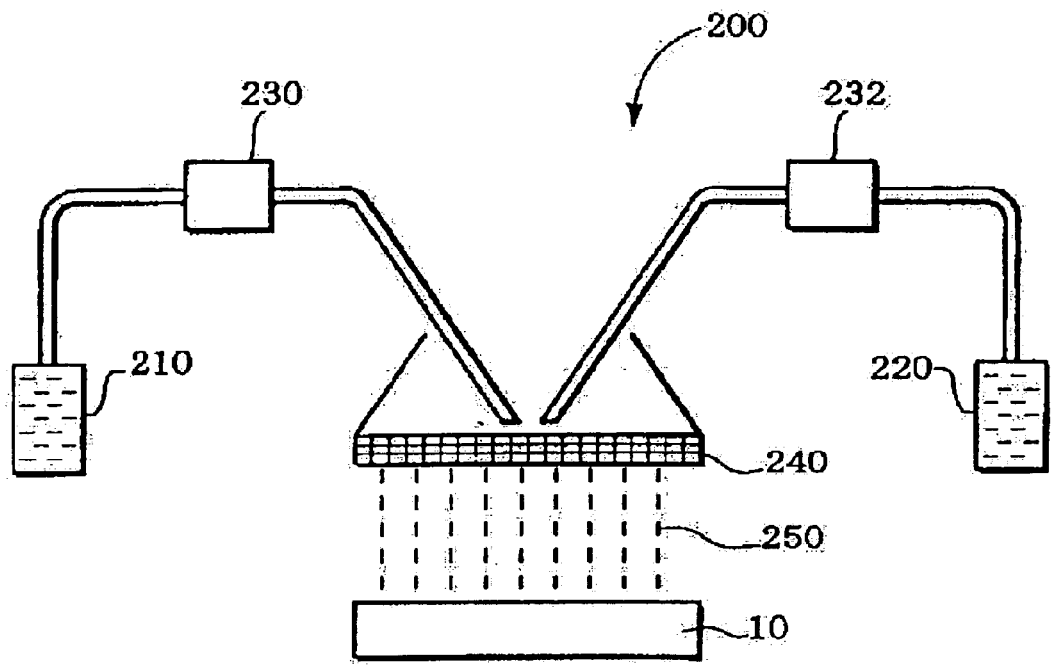
FIG. 6 is a view schematically showing a device for forming a misted raw material on a substrate in an embodiment of the present invention.

Deposition by using the LSMCD process in which the raw materials are deposited in a misted state is described below. FIG. 6 is a cross-sectional view schematically showing a device 200 used for deposition.

Figure 7:
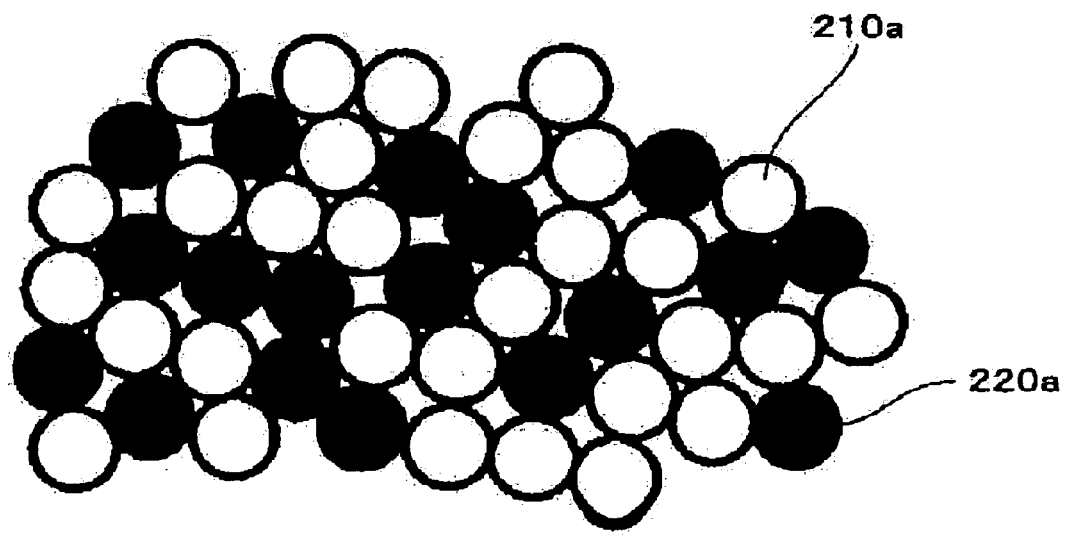
FIG. 7 is a plan view showing a ferroelectric film in an embodiment of the present invention.

A first raw material 210 is sent to a mesh 240 through an atomizer 230. The first raw material is allowed to pass through the mesh 240 to form a mist 250 and is supplied to a substrate 10. A second raw material 220 is allowed to pass through an atomizer 232 and the mesh 240 to form a mist 250, and is supplied to the substrate 10. FIG. 7 is a plan view schematically showing a deposition state when supplying the first raw material and the second raw material at the same time. The deposited raw material film consists of a mist 210a of the raw material 210 and a mist 220a of the raw material 220. The subsequent heat treatment may be performed under the same conditions as described above. The LSMCD process can easily create a state in which a ferroelectric raw material and a paraelectric raw material are dispersed in the direction of the surface of the film.

Figure 8:
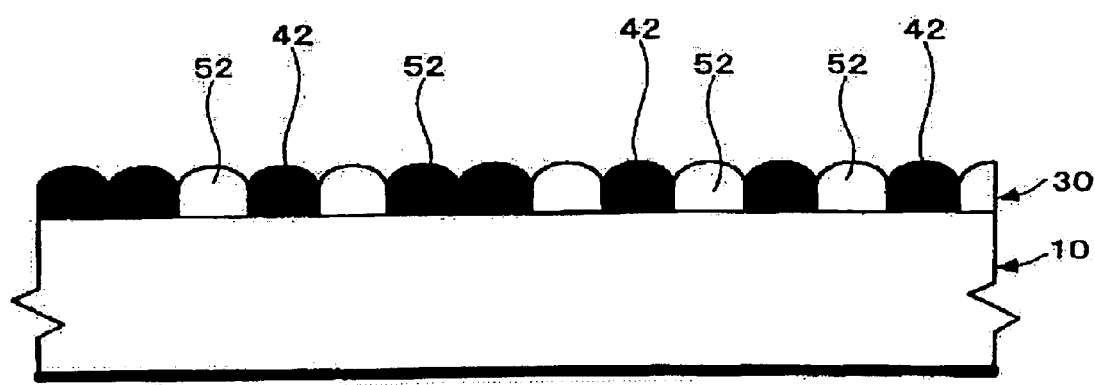
FIG. 8 is a cross-sectional view showing a ferroelectric film in an embodiment of the present invention.

FIG. 8 is a cross-sectional view schematically showing a mixed thin film containing a ferroelectric phase and a paraelectric phase after crystallization. FIG. 8 schematically shows a film in a state in which a ferroelectric phase 42 is continuously formed in the direction of the thickness of the film and the ferroelectric phase 42 is interrupted and dispersed by a paraelectric phase 52 in the surface direction. A ferroelectric capacitor having good hysteresis characteristics can also be obtained by this method. In a spin coating method, the amount of the paraelectric material must be greater than the amount of the ferroelectric material in order to cause the ferroelectric phase and the paraelectric phase to be clearly dispersed in the surface direction. The effect of preventing occurrence of 90° domains by this technique is considered to result by causing the ferroelectric phase to be interrupted and dispersed by the paraelectric in the surface direction, rather than by the mechanism of applying compression stress to the ferroelectric phase.

2. Ferroelectric Memory Device

Figure 3A:
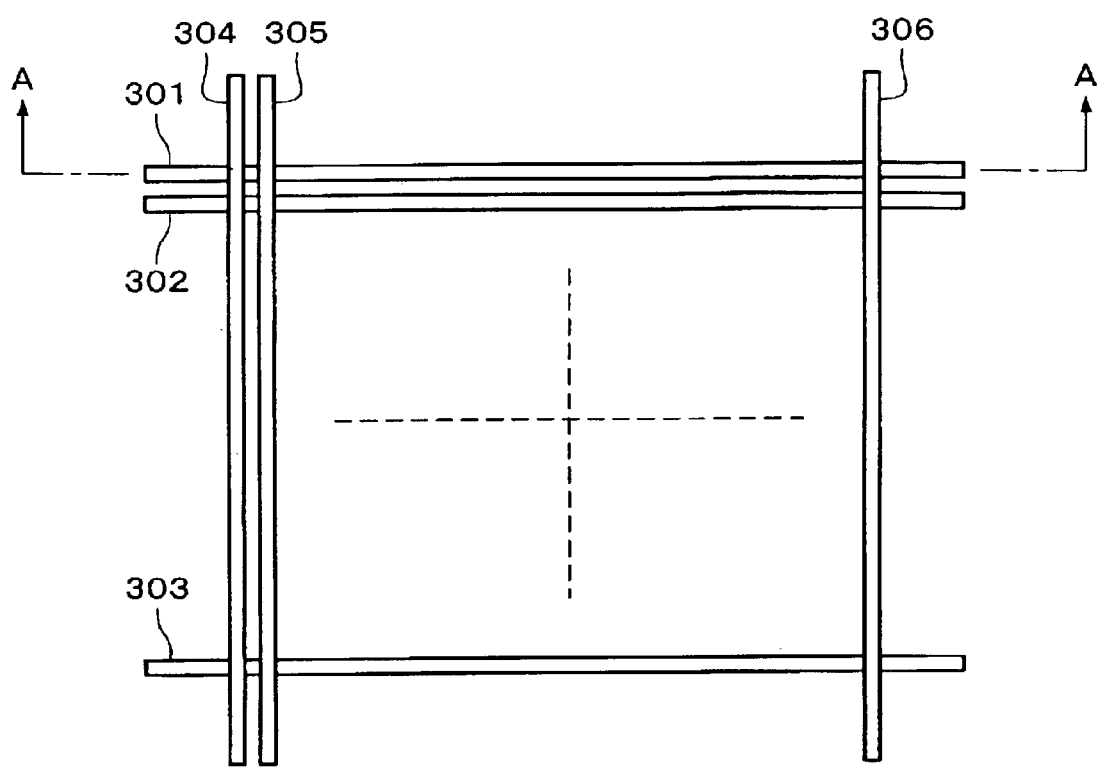
Figure 3B:
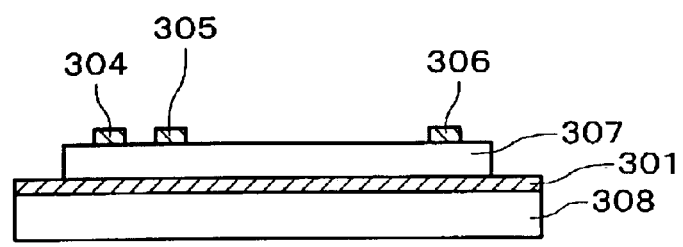

FIGS. 3A and 3B are views showing a configuration of the simple matrix type ferroelectric memory device of the present embodiment. FIG. 3A is a plan view of the ferroelectric memory device, and FIG. 3B is a cross-sectional view along the line A—A shown in FIG. 3A. In FIG. 3A, 301 to 303 indicate a predetermined number of word lines arranged on a substrate 308, and 304 to 306 indicate a predetermined number of bit lines arranged on the substrate 308. A ferroelectric film 307 which includes a ferroelectric phase and a paraelectric phase in a mixed state is interposed between the word lines 301 to 303 and the bit lines 304 to 306. Ferroelectric capacitors are formed in intersecting regions of the word lines and the bit lines.

In the ferroelectric memory device in which memory cells are arranged in a simple matrix, data is written in and read from the ferroelectric capacitors formed in the intersecting regions of the word lines and the bit lines by a peripheral driver circuit, reading amplifier circuit, and the like (not shown) (these circuits are hereinafter called "peripheral circuit"). The peripheral circuit may be formed by MOS transistors on a substrate differing from the substrate of the memory cell array and connected with the word lines and the bit lines. The peripheral circuit and the memory cell array may be integrated on a single substrate by using a single crystal silicon substrate as the substrate 308.

Figure 4:
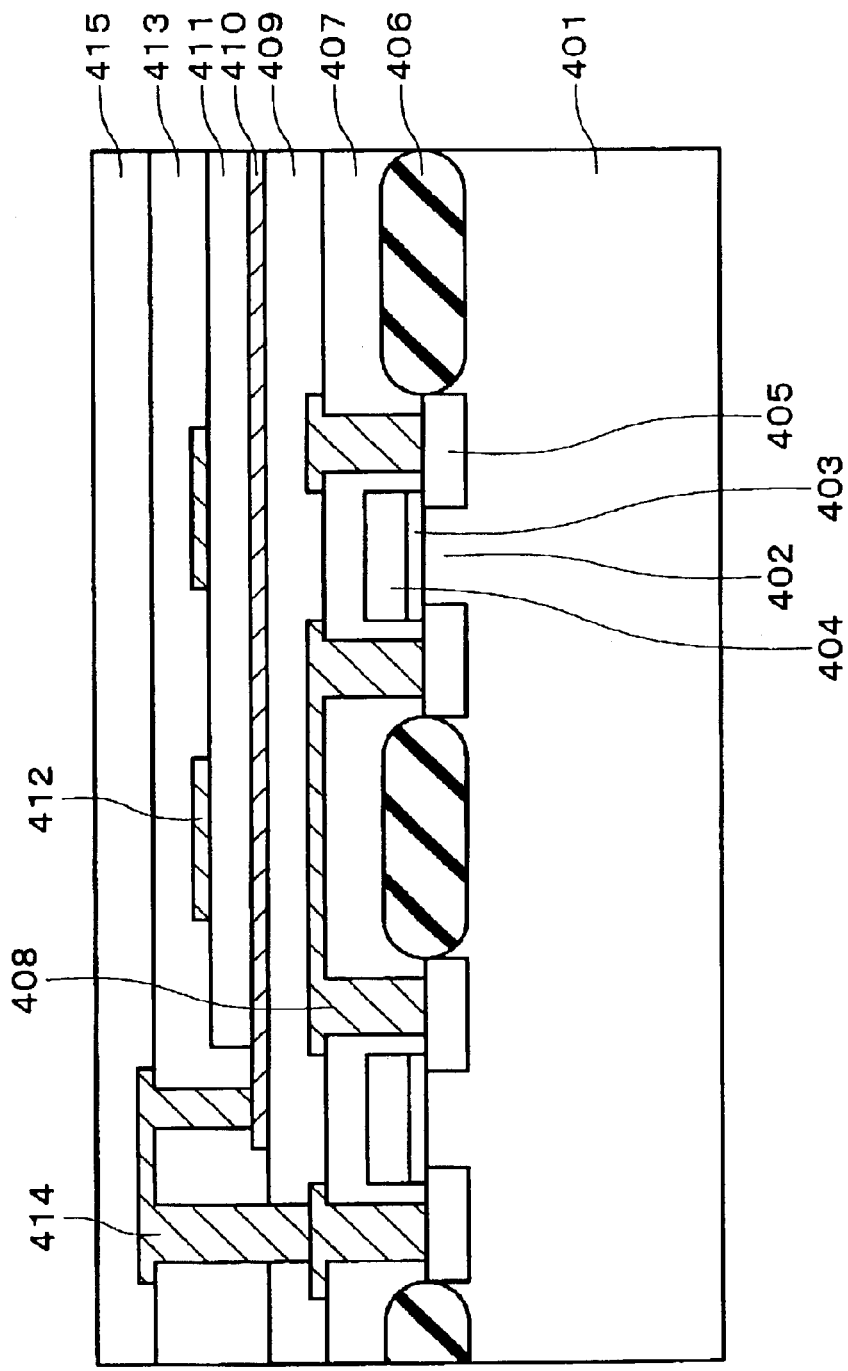
FIG. 4 is a cross-sectional view showing an example of a ferroelectric memory device in an embodiment of the present invention in which a memory cell array is integrated with a peripheral circuit on a single substrate.

FIG. 4 is a cross-sectional view showing an example of the ferroelectric memory device in which the memory cell array and the peripheral circuit are integrated on a single substrate. In FIG. 4, MOS transistors 402 are formed on a single crystal silicon substrate 401. The formation region for the transistors 402 becomes a peripheral circuit section. The MOS transistor 402 is made up of the single crystal silicon substrate 401, source/drain regions 405, a gate insulating film 403, and a gate electrode 404. 406 indicates an oxide film for element isolation, 407 indicates a first interlayer dielectric, and 408 indicates a first interconnection layer. 409 indicates a second interlayer dielectric, and 410 indicates a lower electrode (first electrode or second electrode) of the ferroelectric capacitor, which becomes either the word line or the bit line. 411 indicates a ferroelectric film, and 412 indicates an upper electrode (second electrode or first electrode) formed on the ferroelectric film, which becomes either the bit line or the word line.

The memory cell array is formed by the lower electrode 410, the ferroelectric film 411 including the ferroelectric phase and the paraelectric phase, and the upper electrode 412. 413 indicates a third interlayer dielectric, and 414 indicates a second interconnection layer. The memory cell array is connected with the peripheral circuit section by the second interconnection layer 414. 415 indicates a protective film. According to the ferroelectric memory device having the above configuration, the memory cell array and the peripheral circuit section can be integrated on a single substrate. FIG. 4 shows a configuration in which the memory cell array is formed on the peripheral circuit section. However, a configuration in which the memory cell array is not disposed on the peripheral circuit section and the memory cell array is adjacent to the peripheral circuit section on a plane may also be employed.

The ferroelectric capacitor used in the present embodiment extremely excels in squareness of the hysteresis and has stable disturbance characteristics. Moreover, damage to the peripheral circuit and other elements is reduced due to a decrease in process temperature and process damage (reduction by hydrogen, in particular) is small, whereby deterioration of the hysteresis of the ferroelectric capacitor can be prevented. Therefore, use of such a ferroelectric capacitor enables a simple matrix type ferroelectric memory device to be driven.

3. EXAMPLES

The present invention is described below in more detail by way of embodiments.

First Example

In this exmple, SBT was used as a ferroelectric material. A first raw material liquid for forming a ferroelectric was obtained as follows. 1100 ml of a toluene solution of bismuth 2-ethylhexanoate at a concentration of 0.1 mol/l, 400 ml of a toluene solution of strontium 2-ethylhexanoate at a concentration of 0.1 mol/l, 1000 ml of a toluene solution of tantalum ethoxide at a concentration of 0.1 mol/l, and 100 g of 2-ethylhexane were mixed to prepare a mixed liquid. After refluxing the mixed liquid at 120° C. for one hour in a nitrogen atmosphere, the solvent was evaporated at atmospheric pressure. Toluene was added to the mixture so that the oxide concentration as $Sr_{0.8}Bi_{2.2}Ta_2Ox$ (SBT) was 0.1 mol/l to obtain a first raw material liquid.

A second raw material liquid for forming a paraelectric was obtained as follows. 1500 ml of a toluene solution of bismuth 2-ethylhexanoate at a concentration of 0.1 mol/l, 750 ml of a toluene solution of silicon ethoxide at a concentration of 0.1 mol/l, and 100 g of 2-ethylhexane were mixed to prepare a mixed liquid. After refluxing the mixed liquid at 120° C. for one hour in a nitrogen atmosphere, the solvent was evaporated at atmospheric pressure. Toluene was added to the mixture so that the oxide concentration as $Bi_2Si_1O_5$ was 0.1 mol/l to obtain a second raw material liquid.

The resulting first raw material liquid and the second raw material liquid were mixed to obtain five types of mixed liquids having different volume mixing ratios. The volume mixing ratios of the mixed liquids were 100:50, 100:40, 100:30, 100:20, and 100:900.

The mixed liquids were deposited according to the flowchart shown in FIG. 5. After repeating twice a series of steps consisting of the pretreatment heating step, solution coating step, dry thermal treatment step, and baking step, the baked product was sintered to form a capacitor. Specific deposition conditions are given below. The pretreatment heating step was performed at 180° C. for 30 seconds. The mixed liquid was applied to a platinum electrode for 30 seconds by using a spin coater (3000 rpm). The dry thermal treatment was performed at 160° C. for one minute in a nitrogen atmosphere. The baking step was performed by using RTA at 250 to 280° C. for 30 seconds in an oxygen atmosphere. The sintering step was performed by using RTA at 600 to 700° C. for 60 minutes in an oxygen atmosphere. The thickness of the ferroelectric films after sintering was 50 nm. After forming a platinum electrode by sputtering, annealing was performed in a mixed gas atmosphere of argon and oxygen at 3 atm to obtain five types of ferroelectric capacitors. Each of these ferroelectric capacitors had a good hysteresis.

Second Example

In this example, $Bi_4W_{0.1}V_{0.2}Si_{0.1}Ge_{0.1}Ti_{2.5}O_{12}$ (BWVSGT1) and $Bi_4W_{0.2}V_{0.4}Si_{0.2}Ge_{0.2}Ti_2O_{12}$ (BWVSGT2), which are materials in which a Bi-based ferroelectric material $Bi_4Ti_3O_{12}$ (BIT) and a paraelectric were mixed, were deposited on a platinum electrode by using a spin coating method.

A procedure for synthesizing a sol-gel solution in this example is described below. A sol-gel solution for forming a $Bi_4(W,V,Si,Ge,Ti)_3O_{12}$ ferroelectric was prepared by mixing a sol-gel solution for forming $Bi_4Ti_3O_{12}$ (BIT) and sol-gel solutions for forming $WSiO_5$ (WSO) and $V_2GeO_7$ (VGO). WSO and VGO are materials known in the art as layered catalytic oxides.

A sol-gel solution for forming BWVSGT1 is a solution in which WSO and VGO, 0.1 mol each, were added to 1 mol of the BIT sol-gel solution. A sol-gel solution for forming BWVSGT2 is a solution in which WSO and VGO, 0.2 mol each, were added to 1 mol of the BIT sol-gel solution.

A Pt coated Si substrate was used as a substrate. Thin films with a thickness of 100 nm were formed on the substrate by using the sol-gel solutions for forming a ferroelectric according to the present invention prepared by the above procedure under the following deposition conditions. Crystallization was performed at 550° C. for 20 minutes in oxygen at 1 atm.

Formation conditions for ferroelectric film:
(a) Spin coating (500 rpm for 5 sec→400 rpm for 20 sec)
(b) Drying (150° C. for 2 min in air)
(c) Baking for removing organic element in the coated material (400° C. for 5 min in air)
(d) Sintering (crystallization) (550° C. for 20 min by RTA in $O_2$ at 1 atm)

Figure 9:
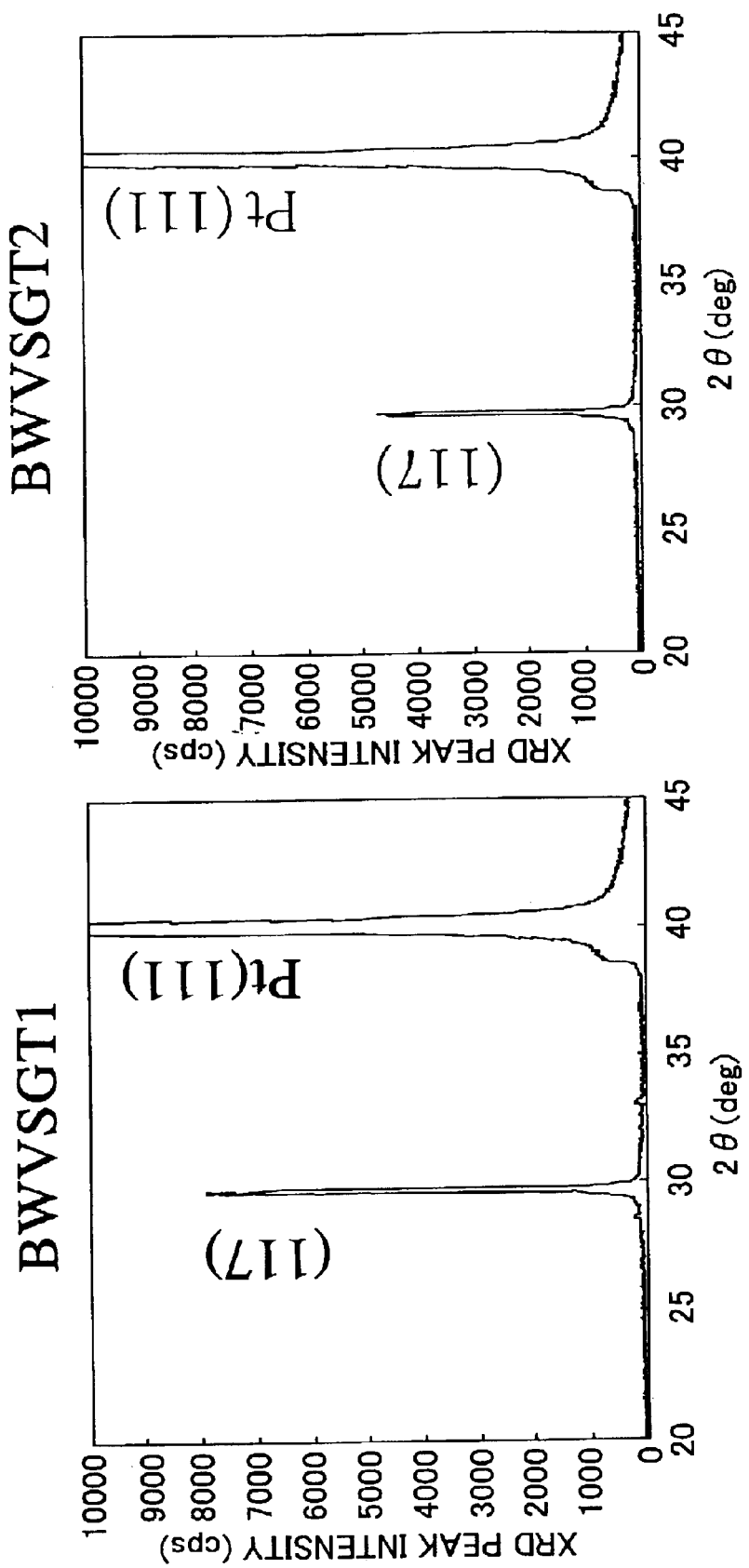
FIG. 9 is a view showing XRD patterns of ferroelectric films in an example of the present invention.

After successively repeating the steps (a), (b), and (c) four times, the step (d) was performed. FIG. 9 shows XRD patterns of each of the resulting ferroelectric thin films. As shown in FIG. 9, BWVSGT1 and BWVSGT2 were (117) single oriented films.

A Pt upper electrode was then formed to obtain ferroelectric capacitors. Ferroelectric characteristics of the ferroelectric capacitors were evaluated.

Figure 10:
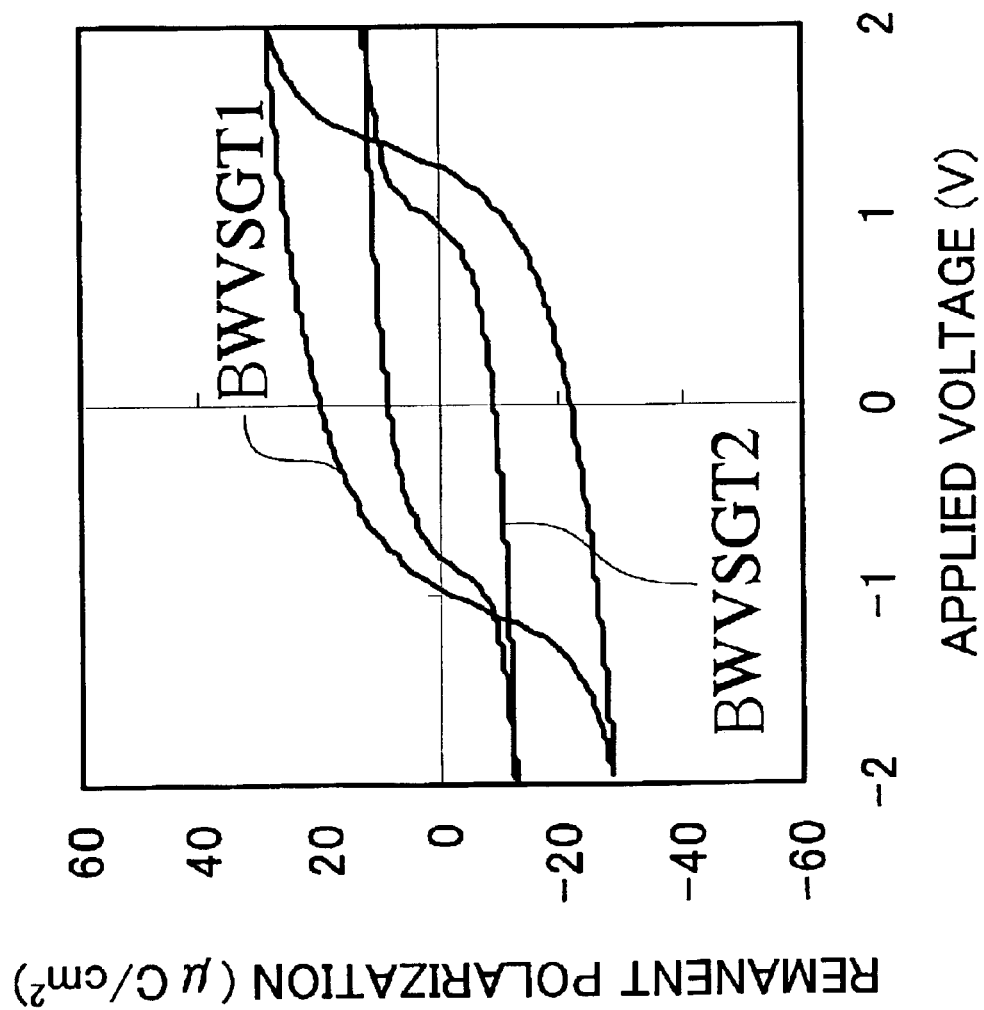
FIG. 10 is a view showing hysteresis of a capacitor in an example of the present invention.

As a result of evaluation of D-E hysteresis characteristics, BWVSGT1 and BWVSGT2 showed good squareness suitable for the ferroelectric memory device of the present invention, as shown in FIG. 10. BWVSGT1 had a polarization Pr of 18 $\mu C/cm^2$ and BWVSGT2 had a polarization Pr of 10 $\mu C/cm^2$.

Since the Pr was significantly decreased in the case where one or more Ti in the B site of BIT were replaced, it was found that it is difficult to apply such a film to the ferroelectric memory device of the present invention.

Third Example

This example relates to a Pb-based ferroelectric material.

In this example, $Pb_{1.1}Zr_{0.1}Ti_{0.8}Si_{0.1}O_3$ (PZTS1) and $Pb_{1.1}Zr_{0.7}Ti_{0.2}Si_{0.1}O_3$ (PZTS2) were deposited on a platinum electrode by using a spin coating method. A procedure for synthesizing a sol-gel solution in this example is described below. A ferroelectric material was prepared by mixing a sol-gel solution for forming a $PbZrTiO_3$ (PZT) ferroelectric and a sol-gel solution for forming $PbSiO_3$ (PSO).

Thin films were formed by using solutions in which 0.01 mol of PSO was added to 1 mol of PZT sol-gel solutions in which the amount of excess Pb was 0, 5, 10, and 20%, respectively. A Pt coated Si substrate was used as a substrate. Thin films with a thickness of 100 nm were formed by using the sol-gel solutions for forming a ferroelectric prepared by the above procedure under the following deposition conditions. Crystallization was performed at 425° C. for 10 minutes in oxygen at 1 atm.

Formation conditions for ferroelectric film:
(a) Spin coating (500 rpm for 5 sec→4000 rpm for 20 sec)
(b) Drying (150° C. for 2 min in air)
(c) Baking for removing organic element in the coated material (250° C. for 5 min in air)
(d) Sintering (crystallization) (425° C. for 10 min by RTA in $O_2$ at 1 atm)

Figure 11:
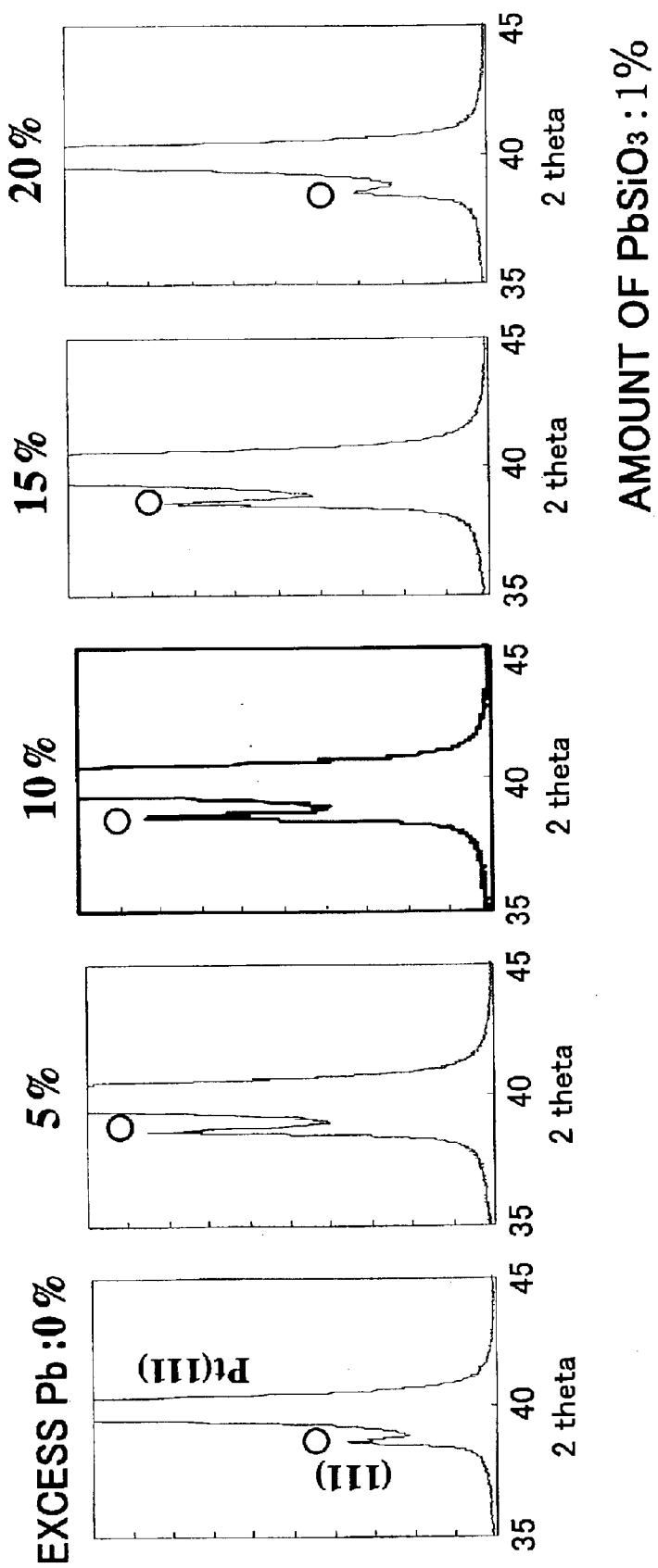
FIG. 11 is a view showing XRD patterns of ferroelectric films in an example of the present invention.

After successively repeating the steps (a), (b), and (c) four times, the step (d) was performed. The resulting capacitors had XRD patterns as shown in FIG. 11. The capacitors had a maximum crystallinity when the amount of excess Pb was 5%. Since Pb is easily volatilized due to high vapor pressure, about 20% of an excess Pb component is generally added to a solution in advance in order to compensate for volatilization. However, this example, in which the solution to which 0.01 mol of PSO was added was used, showed that it suffices that the amount of excess Pb added to the PZT sol-gel solution be about 5%. This suggests that PSO added in this example prevents volatilization of the excess Pb component in the PZT sol-gel solution by unknown functions, and Pb in the PSO does not merely function as the excess Pb component.

Fourth Example

Taking into consideration the results obtained in Third Example, PZTS thin films were formed by using a solution in which 0.1 mol of PSO was added to 1 mol of a PZT sol-gel solution to which 5% of an excess Pb component was added. In this example, PZTS1 and PZTS2 thin films were formed.

PZT is a solid solution of an anti-ferroelectric $PbZrO_3$ and a ferroelectric $PbTiO_3$. It is known in the art that $PbZr_{0.52}Ti_{0.48}O_3$ in which $PbzrO_3$ and $PbTiO_3$ are mixed at almost 1:1 separates the crystal system of PZT. In the case where the Ti content is greater than the Zr content, the PZT has a tetragonal structure. In the case where the Zr content is greater than the Ti content, the PZT has a rhombohedral structure. In this example, a PZTS1 thin film having a tetragonal structure and a PZTS2 thin film having a rhombohedral structure were formed.

A Pt coated Si substrate was used as a substrate. Thin films with a thickness of 100 nm were formed under the above-described thin film deposition conditions. Crystallization was performed at 425° C. for 10 minutes in oxygen at 1 atm. However, the PZTS2 thin film was formed by applying ultraviolet rays for 10 minutes using a UV 1 amp at a wavelength of 254 nm after the baking step.

Figure 12:
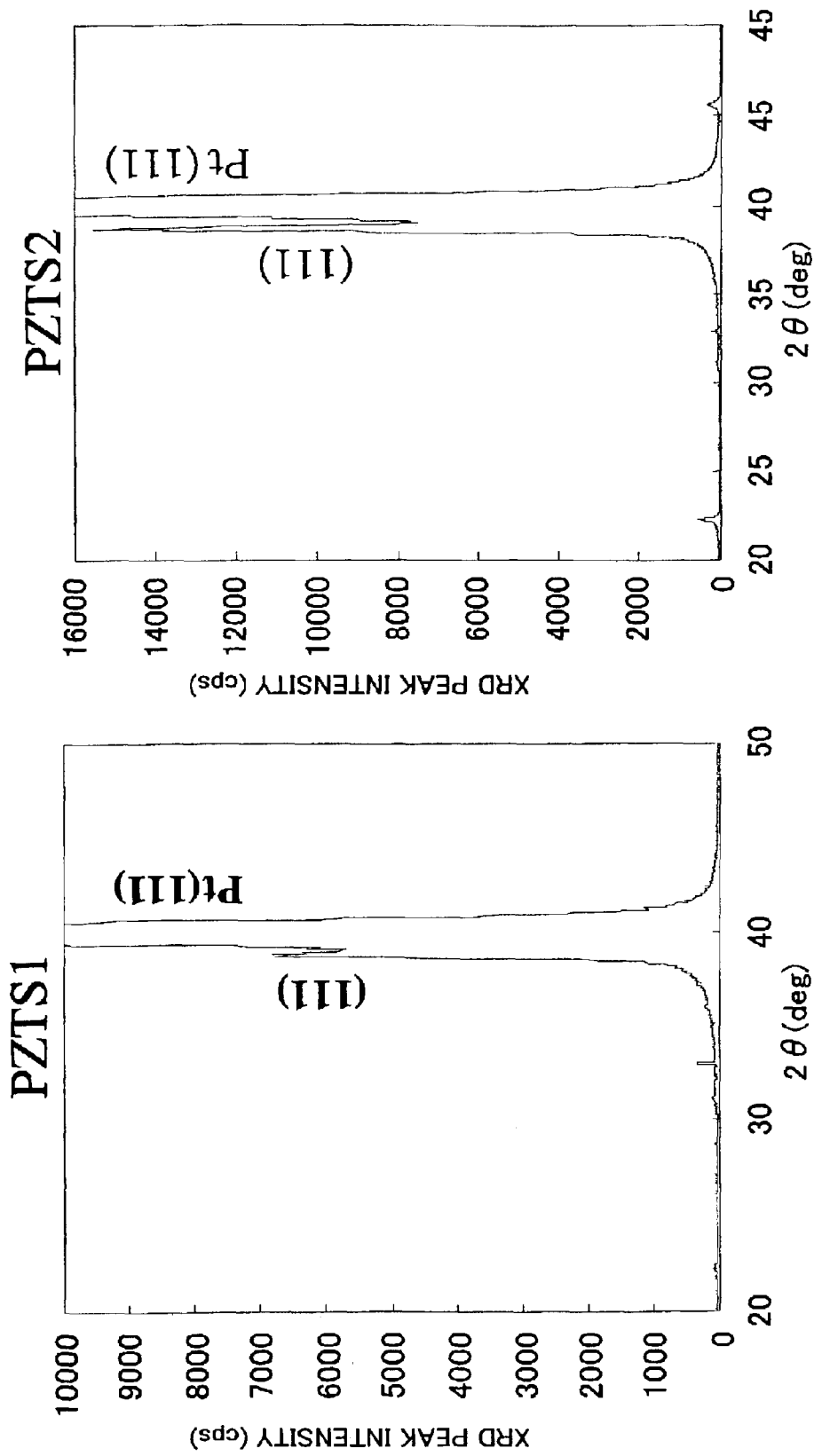
FIG. 12 is a view showing XRD patterns of ferroelectric films in an example of the present invention.

FIG. 12 shows XRD patterns of the resulting PZTS1 and PZTS2 ferroelectric films. As shown in FIG. 12, PZTS1 was a (111) single oriented film and PZTS2 was a (100) single oriented film. Therefore, it was confirmed that a (100) single oriented PZT film can be obtained by applying ultraviolet rays.

After forming a Pt upper electrode, pressure annealing was performed for 30 minutes in an $O_2$ atmosphere at 9.9 atm to obtain ferroelectric capacitors. Ferroelectric characteristics of the ferroelectric capacitors were evaluated.

Figure 13:
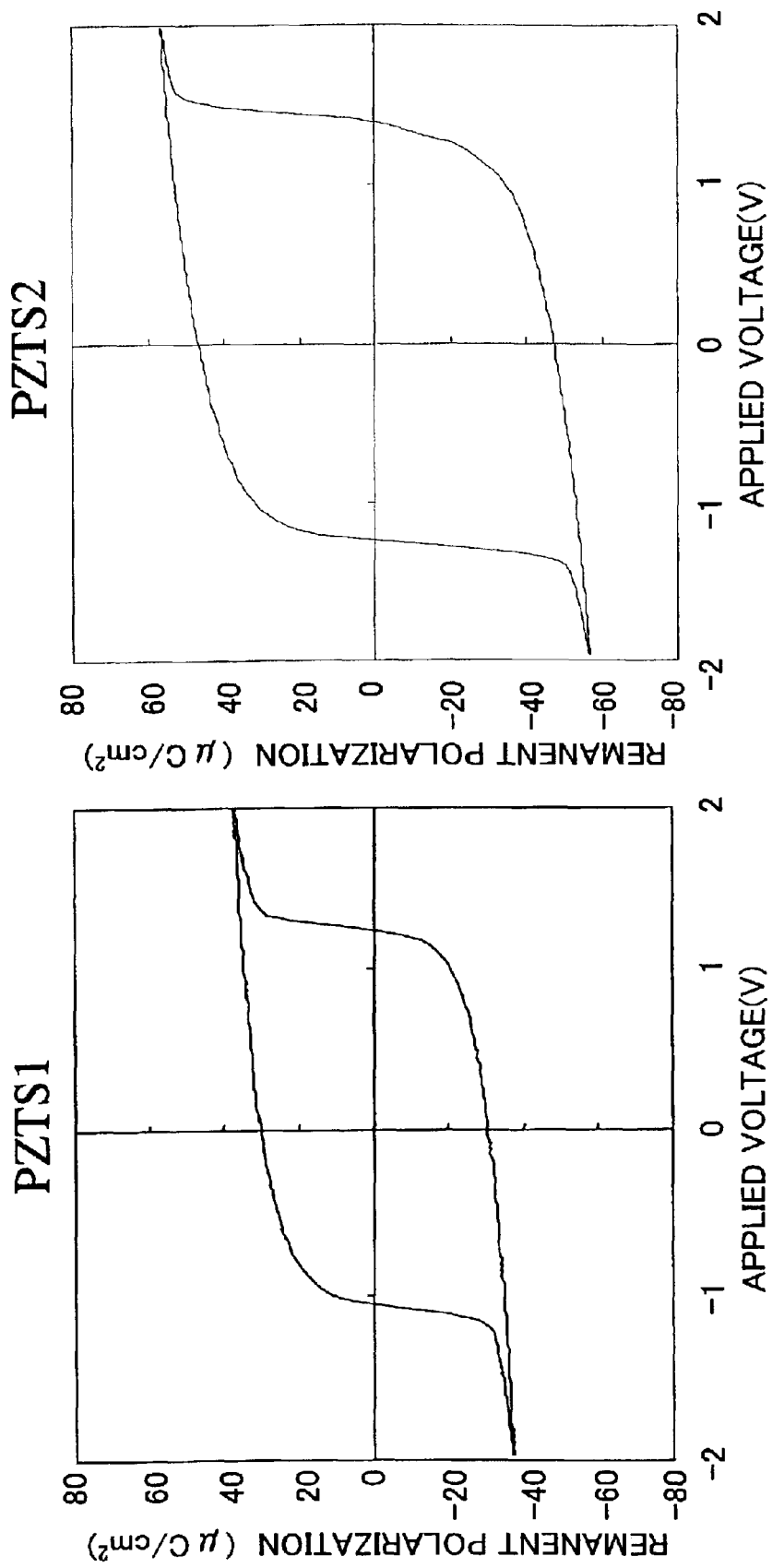
FIG. 13 is a view showing hysteresis of capacitors in an example of the present invention.

As a result of evaluation of D-E hysteresis characteristics, PZTS1 and PZTS2 showed good squareness suitable for the ferroelectric memory device of the present invention, as shown in FIG. 13. PZTS1 had a polarization Pr of 45 $\mu C/cm^2$ and PZTS2 had a polarization Pr of 30 $\mu C/cm^2$.

Figure 14:
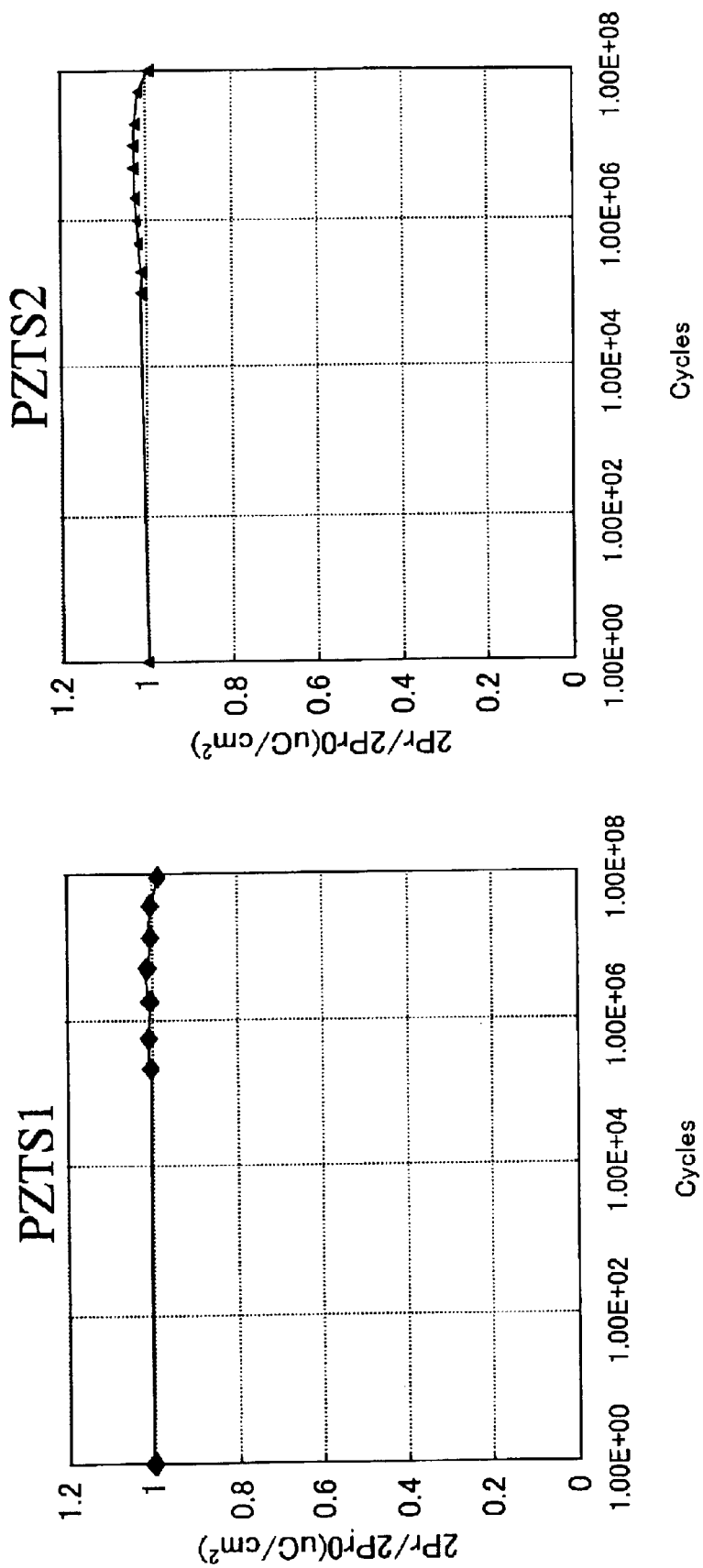
FIG. 14 is a view showing fatigue characteristics of capacitors in an example of the present invention.

As a result of evaluation of fatigue characteristics, these films showed good fatigue characteristics as shown in FIG. 14. It is known in the art that a PZT thin film interposed between Pt electrodes has inferior fatigue characteristics. However, the PZT thin films of the present invention to which PSO was added did not show film fatigue, and it is unnecessary to select an oxide electrode for which the processing is difficult, such as Ir or $IrO_2$, as the electrode material. This also suggests effectiveness of the present invention.

Fifth Example

This example relates to a Pb-based ferroelectric. A (Pb, La,Nb,Ca,Sr)(Zr,Ti,Si,Ge)$O_3$(PLNCSZTSG) thin film was formed by using a mixed sol-gel solution in which 4 mol % of a mixture of sol-gel solutions for forming $La_2SiO_5$ (LSO), $PbGeO_3$ (PSO), $NbSiO_4$ (NSO), $CaGeO_3$ (CSO), and $SrSiO_3$ (SSO) mixed at an equal molar ratio was added to a sol-gel solution for forming tetragonal PZT (Zr/Ti=⅖). A thin film with a thickness of 100 nm was formed by using the sol-gel solution for forming a ferroelectric prepared by the above procedure under the following deposition conditions. Crystallization was performed at 425° C. for 10 minutes in oxygen at 1 atm.

Formation conditions for ferroelectric film:
(a) Spin coating (500 rpm for 5 sec→4000 rpm for 20 sec)
(b) Drying (150° C. for 2 min in air)
(c) Baking for removing organic element in the coated material (250° C. for 5 min in air)
(d) Sintering (crystallization) (500° C. for 10 min by RTA in $O_2$ at 1 atm)

After successively repeating the steps (a), (b), and (c) four times, the step (d) was performed. After forming a Pt upper electrode, annealing was performed at 500° C. for 10 minutes in an oxygen atmosphere at 1 atm to obtain a ferroelectric capacitor. Ferroelectric characteristics of the ferroelectric capacitor were evaluated.

Figure 15:
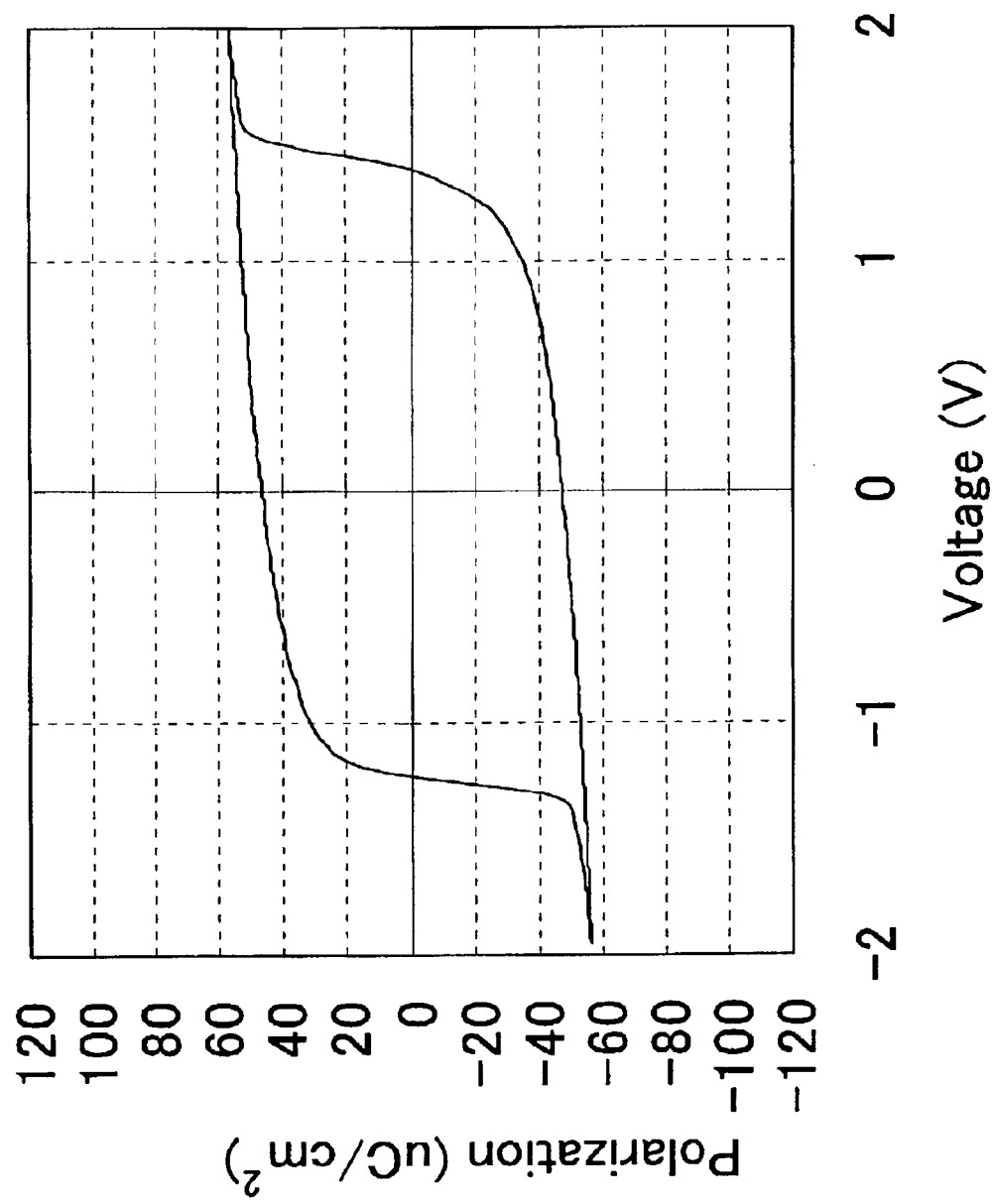
FIG. 15 is a view showing hysteresis of a capacitor in an example of the present invention.

As a result of evaluation of D-E hysteresis characteristics, the capacitor showed good squareness suitable for the ferroelectric memory device of the present invention, as shown in FIG. 15. The capacitor had a polarization Pr of 45 $\mu C/cm^2$.

Figure 16:
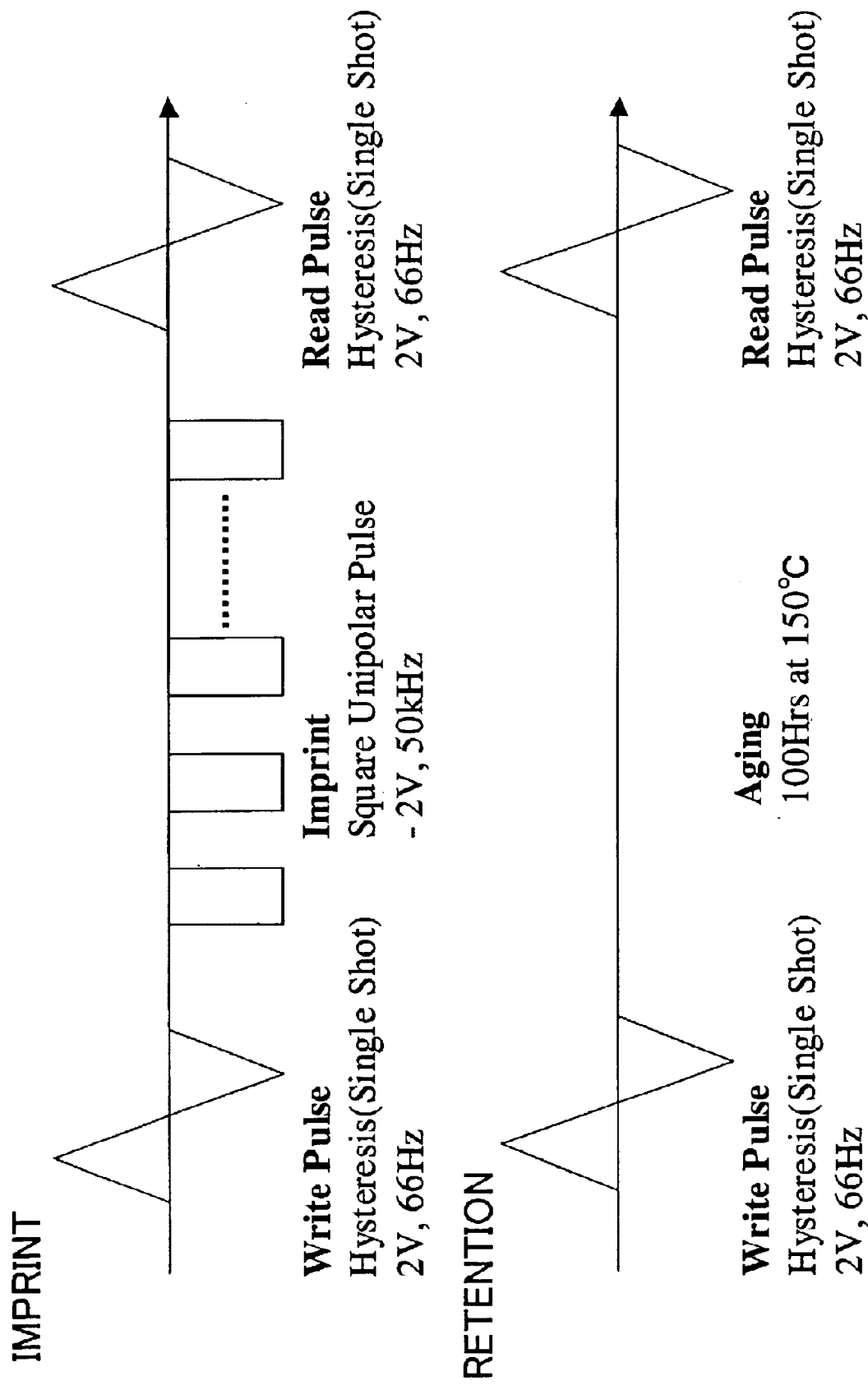
FIG. 16 is a view showing conditions for determining imprint and retention characteristics of a capacitor in an example of the present invention.

Imprint characteristics and data retention characteristics of the ferroelectric capacitor were evaluated under conditions shown in FIG. 16. In more detail, the polarization was reversed once by applying a triangular wave at ±2 V and 66 Hz for only one cycle (+2 V→−2 V) (state in which data is written at −2 V). In the evaluation of imprint characteristics, a square wave at −2 V and 50 kHz was applied for an arbitrary period of time. In the evaluation of retention characteristics, data was retained at 150° C. on a hot plate for an arbitrary period of time, for example. Then, data was read under the same conditions as writing.

Figure 17:
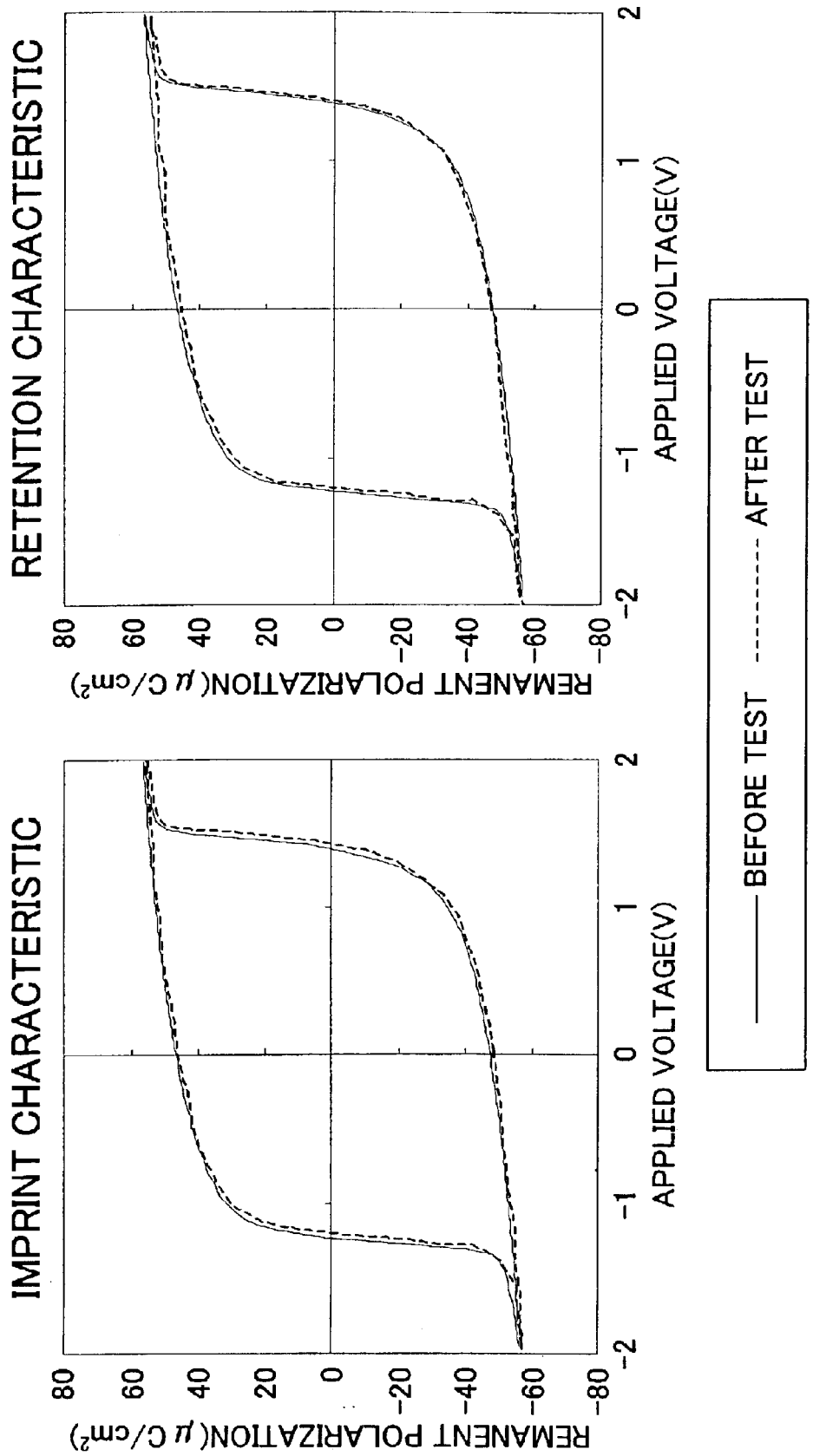
FIG. 17 is a hysteresis diagram showing imprint and retention characteristics of a capacitor in an example of the present invention.

As a result, the ferroelectric capacitor showed good imprint characteristics and retention characteristics as shown in FIG. 17. In FIG. 17, a solid line indicates characteristics before the test, and a dotted line indicates characteristics after the test. As is clear from FIG. 17, it was confirmed that the hysteresis was not substantially changed before and after the test.

Among the sol-gel solutions for forming $La_2SiO_5$ (LSO), $PbGeO_3$ (PSO), $NbSiO_4$ (NSO), $CaGeO_3$ (CSO), and $SrSiO_3$ (SSO) added to PZT, SSO does not function as a catalytic substance. However, it is considered that LSO, PSO, NSO, and CSO were easily added to PZT by the action of catalytic substances, whereby good ferroelectric characteristics were obtained.

PSO has a function of decreasing the amount of excess Pb as described above. It is known in the art that La used as an element for replacing the A site improves fatigue characteristics of PZT, Nb improves squareness of SBT and the like, and Ca and Sr improve imprint characteristics. These elements are usually added to PZT in an amount of several percent. Si and Ge used as elements for replacing the B site increase covalent bonding properties of the constituent elements of PZT, thereby improving reduction resistance.

If a paraelectric is used as an additive, the composition of PZT generally varies from the stoichiometric composition for the amount of the paraelectric. This makes it difficult to ensure that PZT exhibits all excellent ferroelectric characteristics even though various characteristics are improved. In this example, this problem can be solved by mixing the solutions having a stoichiometric composition, whereby extremely good characteristics were obtained as described above.

Figure 18:
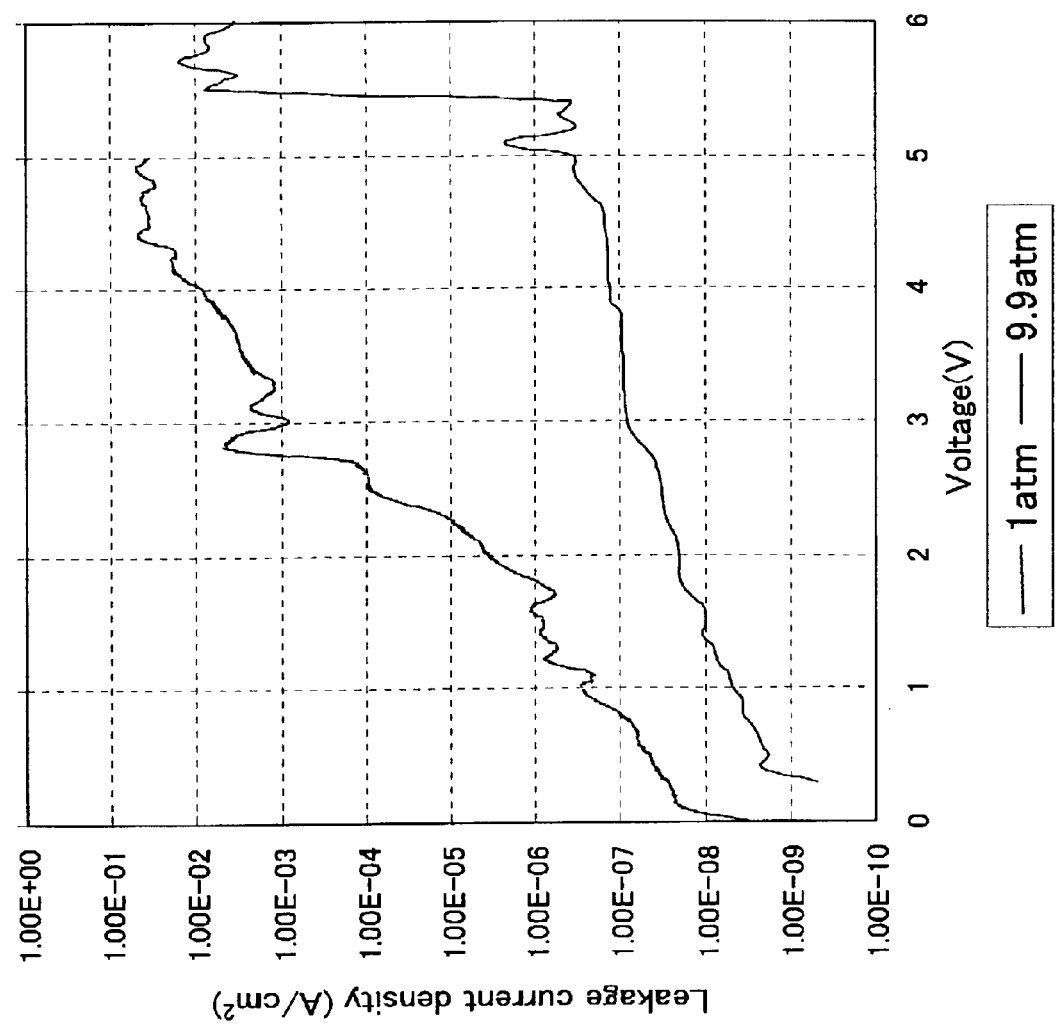
FIG. 18 is a view showing leakage current characteristics of a capacitor in an example of the present invention.

Moreover, good characteristics were obtained without applying pressure by using Si and Ge in combination. The resulting ferroelectric capacitor was pressure-annealed for 30 minutes in an $O_2$ atmosphere at 9.9 atm. As a result, a significant decrease in leakage current was confirmed as shown in FIG. 18.

Sixth Example

In this example, changes in characteristics were examined by changing a ratio R of $Bi_2SiO_5$ (BSO) to a Bi-based layered perovskite ferroelectric thin film material $Bi_4Ti_3O_{12}$ (BIT) (molar ratio of BSO to BIT) from 0.1 to 9. The thickness of the film was 100 nm and the crystallization temperature was 600° C. After performing pressure annealing at 500° C. for three hours in oxygen at 9.9 atm, D-E hysteresis characteristics were evaluated. The thin film was formed according to the following procedure.

Formation conditions for ferroelectric thin film:
(a) Spin coating (500 rpm for 5 sec→4000 rpm for 20 sec)
(b) Drying (150° C. for 2 min in air)
(c) Baking for removing organic element in the coated material (400° C. for 5 min in air)
(d) Sintering (crystallization) (600° C. for 20 min by RTA in $O_2$ at 1 atm)
(e) Post-annealing (500° C. for 180 min by high-pressure annealing in $O_2$ at 9.9 atm)

Figure 19:
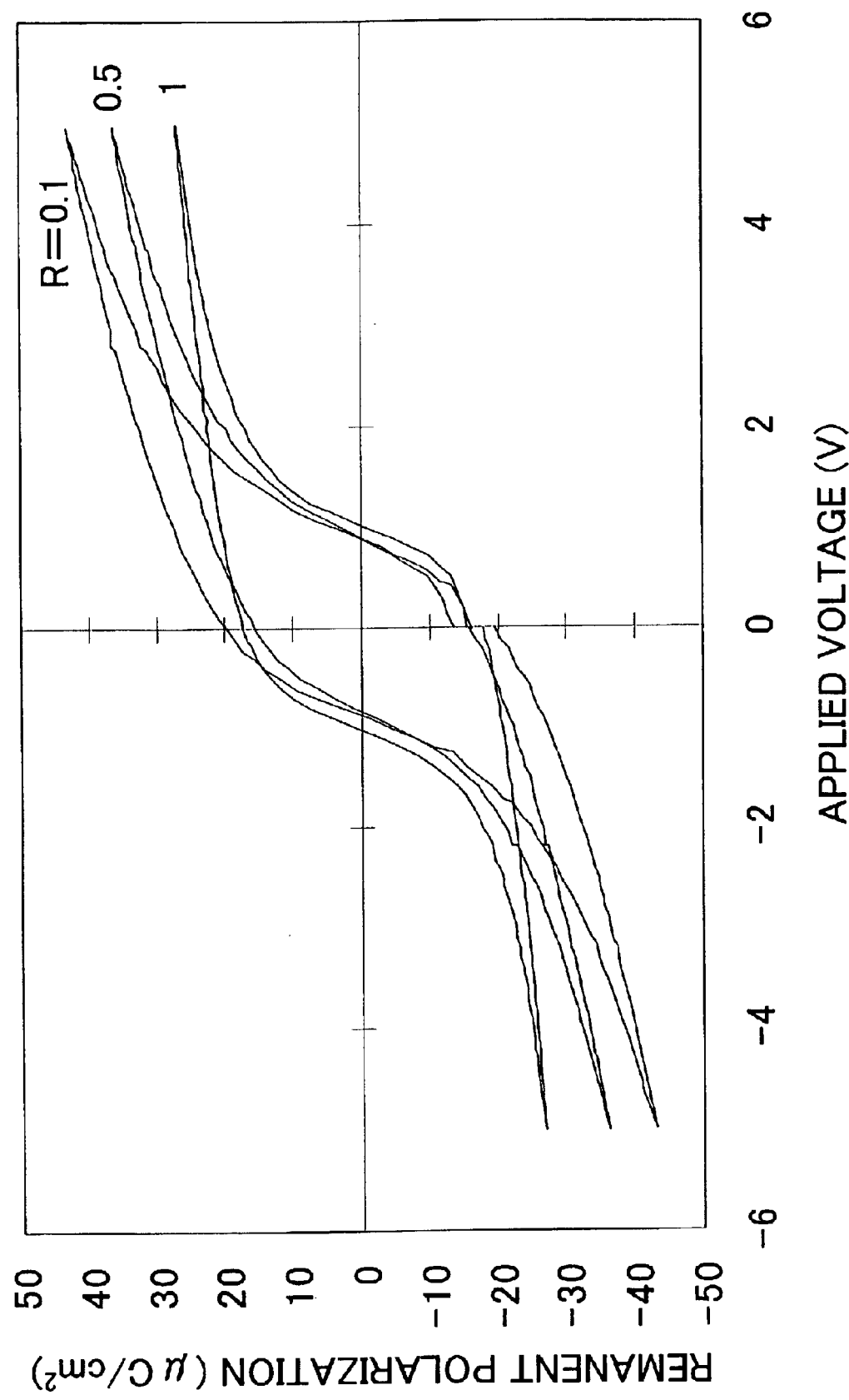
FIG. 19 is a view showing hysteresis of capacitors in an example of the present invention.
Figure 20:
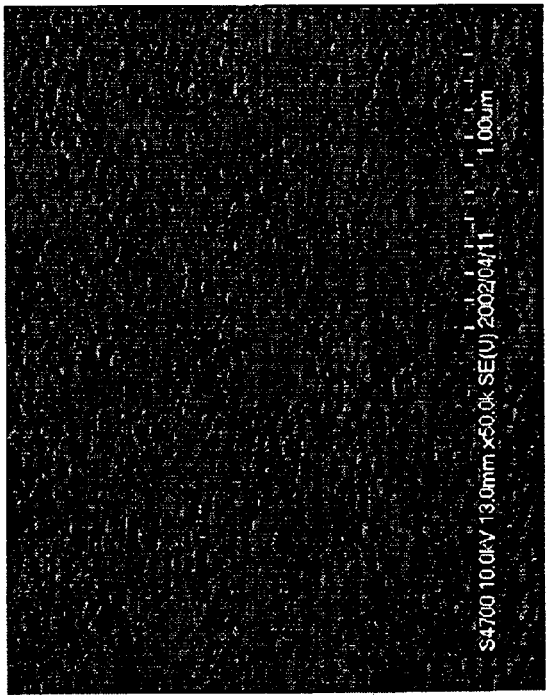
FIG. 20 is photographs of the surface of ferroelectric film in an example of the present invention.
Figure 20:
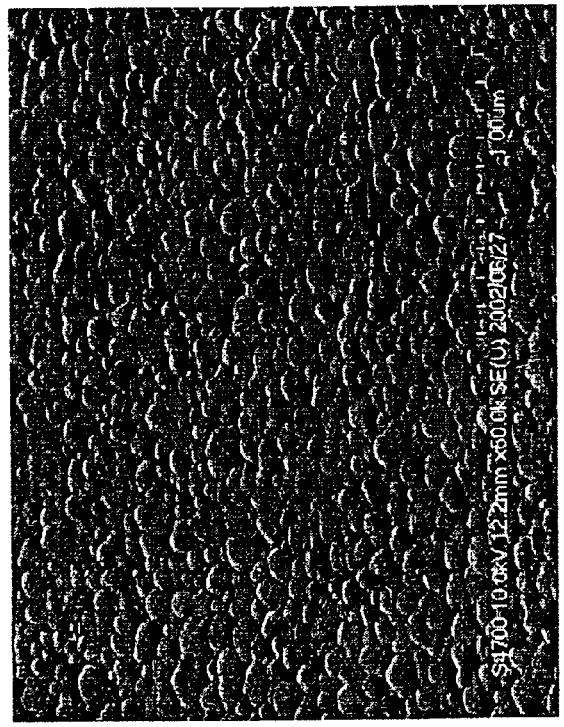

After successively repeating the steps (a), (b), and (c) four times, the steps (d) and (e) were performed. The resulting capacitors showed no BSO peak in the XRD patterns in the range of $0.1 \leq R \leq 1$. The resulting ferroelectric showed a strong (111) orientation. In the evaluation of D-E hysteresis characteristics, the hysteresis shape was improved as the value for R was increased in the range of $0.1 \leq R \leq 1$, as shown in FIG. 19. Moreover, significant improvement of surface morphology was observed. FIG. 20 shows photographs of the surface when R=0 and R=0.1. The grain diameter of the surface of the thin film was significantly decreased when R=0.1. In this example, it was confirmed that the initial nucleus formation density of the ferroelectric was significantly increased. Moreover, the crystallization temperature was decreased and imprint and retention characteristics and hydrogen resistance were improved.

Figure 21:
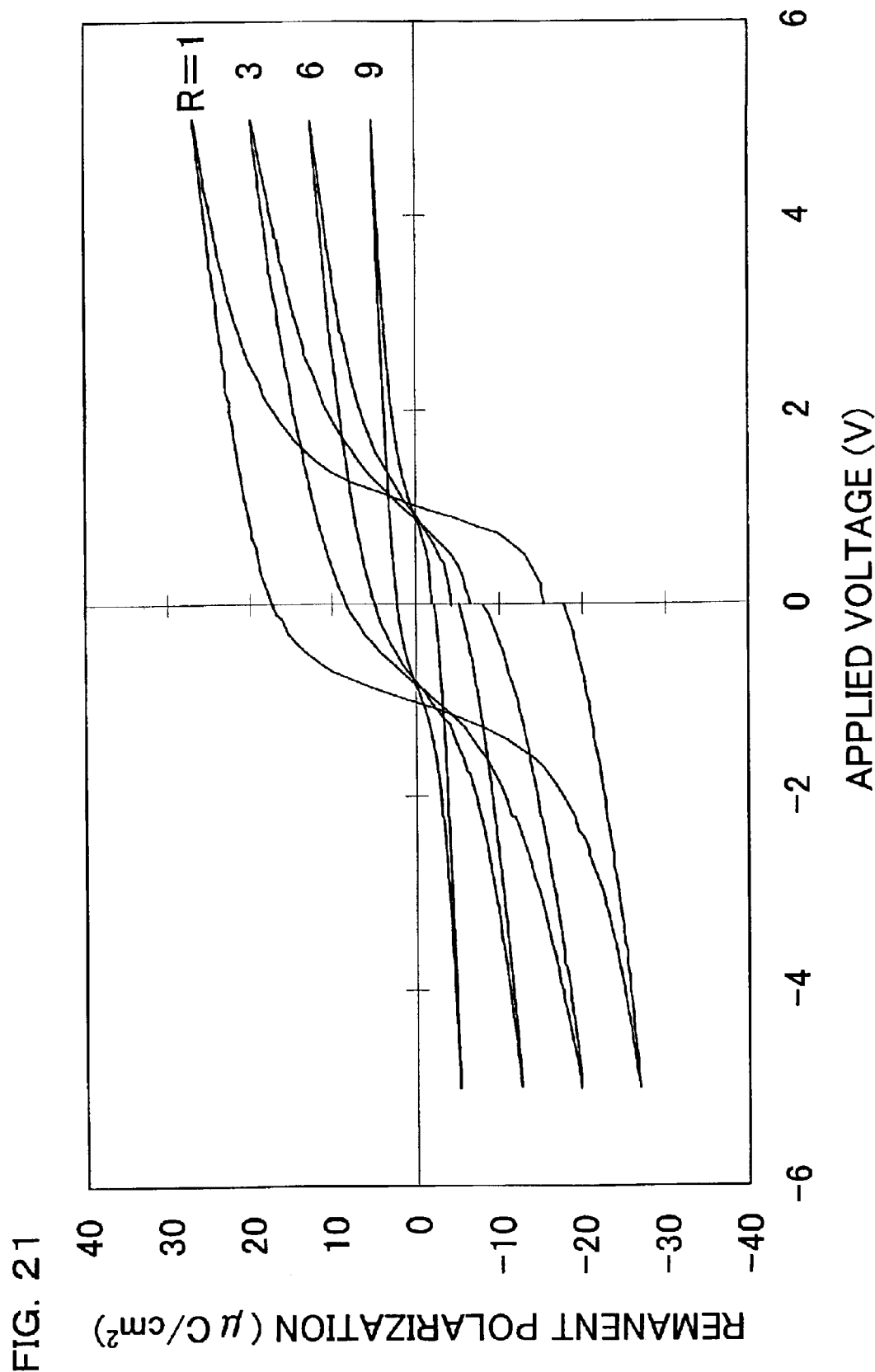
FIG. 21 is a view showing hysteresis of capacitors in an example of the present invention.

The peaks of BIT and BSO were observed at the same time in the XRD patterns in the range of $1 < R \leq 9$. The XRD peak intensity of BSO was increased as the value for R was increased. As shown in FIG. 21, in the evaluation of D-E hysteresis characteristics, a remanent polarization Pr was decreased as the value for R exceeded 1. The remanent polarization Pr was decreased as the value for R was increased. However, Pr was decreased while maintaining a hysteresis shape having good squareness.

Figure 22:
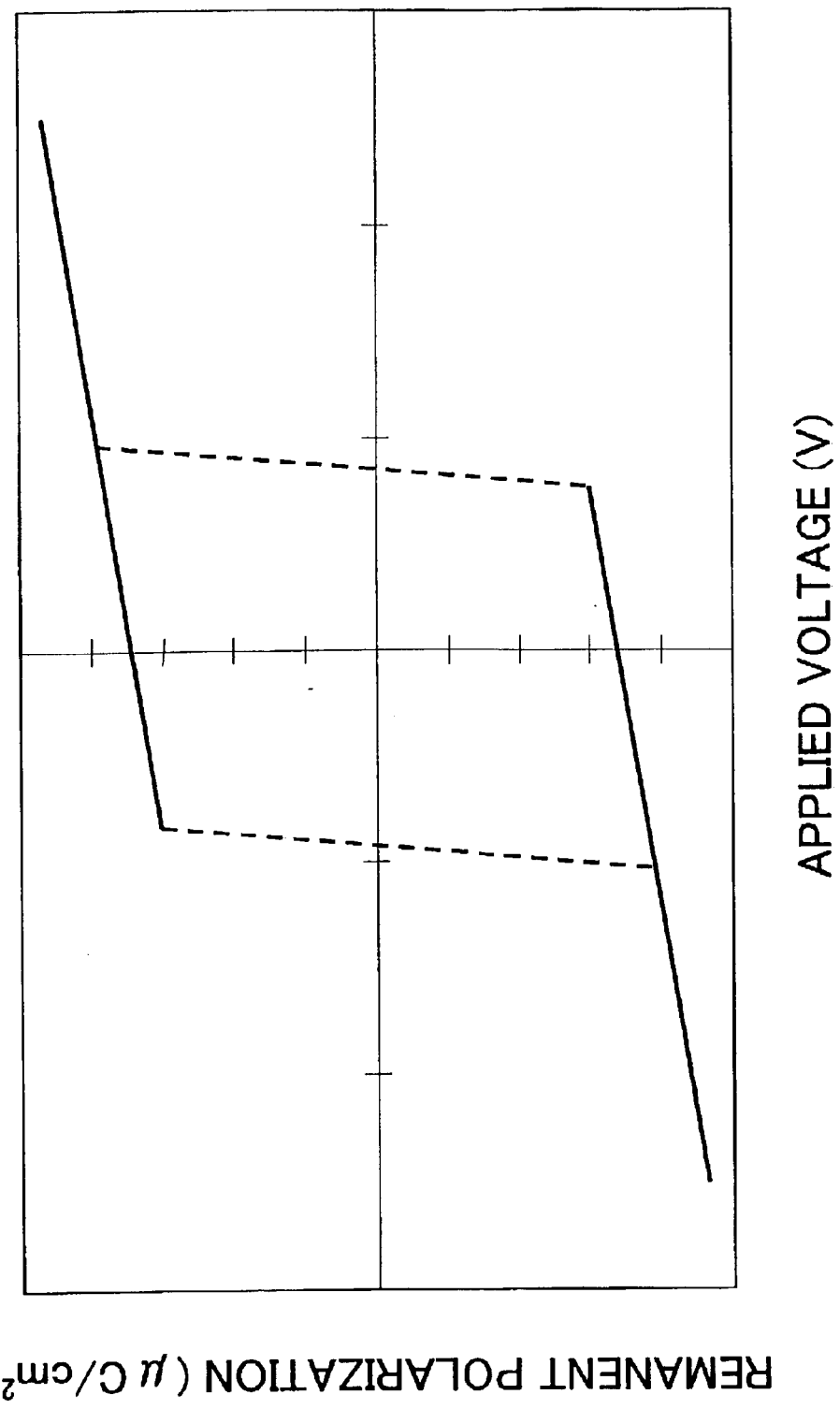
FIG. 22 is a view showing hysteresis of a capacitor.

Details of the hysteresis curve are described below with reference to FIG. 22. As shown in FIG. 22, a hysteresis curve of a ferroelectric consists of dotted lines due to polarization and solid lines indicating inclination (relative dielectric constant) with respect to an electric field. Therefore, it is important that polarization inversion occurs instantaneously and the relative dielectric constant is small in order to obtain a hysteresis curve having good squareness. The present inventors have found that a method of mixing materials having different relative dielectric constants contributes to a decrease in relative dielectric constant, and a method of mixing silicate and germanate materials having a relative dielectric constant as small as 30 with a ferroelectric having a large relative dielectric constant is particularly effective for achieving these characteristics. This enables the crystallization temperature, which is conventionally about 650° C., to be decreased to about 600° C., and imprint and retention characteristics and hydrogen resistance to be improved.

Specifically, BSO and BIT form a solid solution in the range of $0.1 \leq R \leq 1$. In other words, Si in BSO functions to replace the B site of the oxygen octahedron in BIT. However, BSO is in excess of BIT in the film when R exceeds 1, whereby the excess BSO coexists with the BSO-BIT solid solution. In this case, since squareness of the resulting hysteresis remains good, BSO and BIT are present as column-shaped structures interposed between the upper and lower electrodes. The BSO column density becomes greater than the BSO-BIT column density as the value for R is increased, whereby Pr is decreased.

Figure 23:
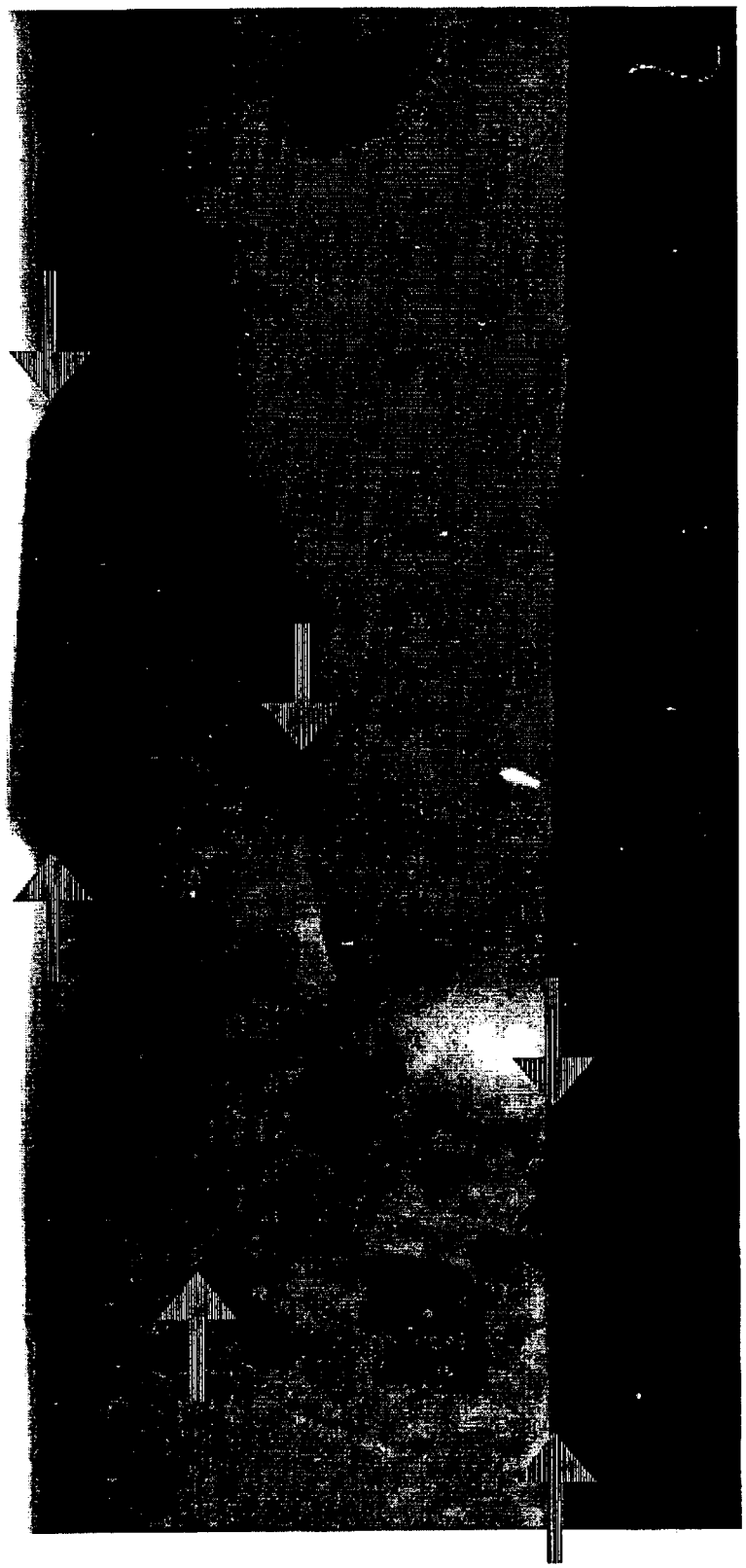
FIG. 23 is a cross-sectional TEM photograph of a ferroelectric film in an example of the present invention.

This is also clear from the cross-sectional TEM photograph shown in FIG. 23. The average diameter of the BSO-BIT columns was 10 nm when R=1. D-E hysteresis was not confirmed when R exceeded 9. Specifically, it is considered that the column-shaped structures of the present invention could not be formed at this time.

Reduction resistance of the BLST capacitor when R=1 was examined. The capacitor was subjected to annealing at 400° C. for 30 minutes in nitrogen containing 3% hydrogen.

Figure 24:
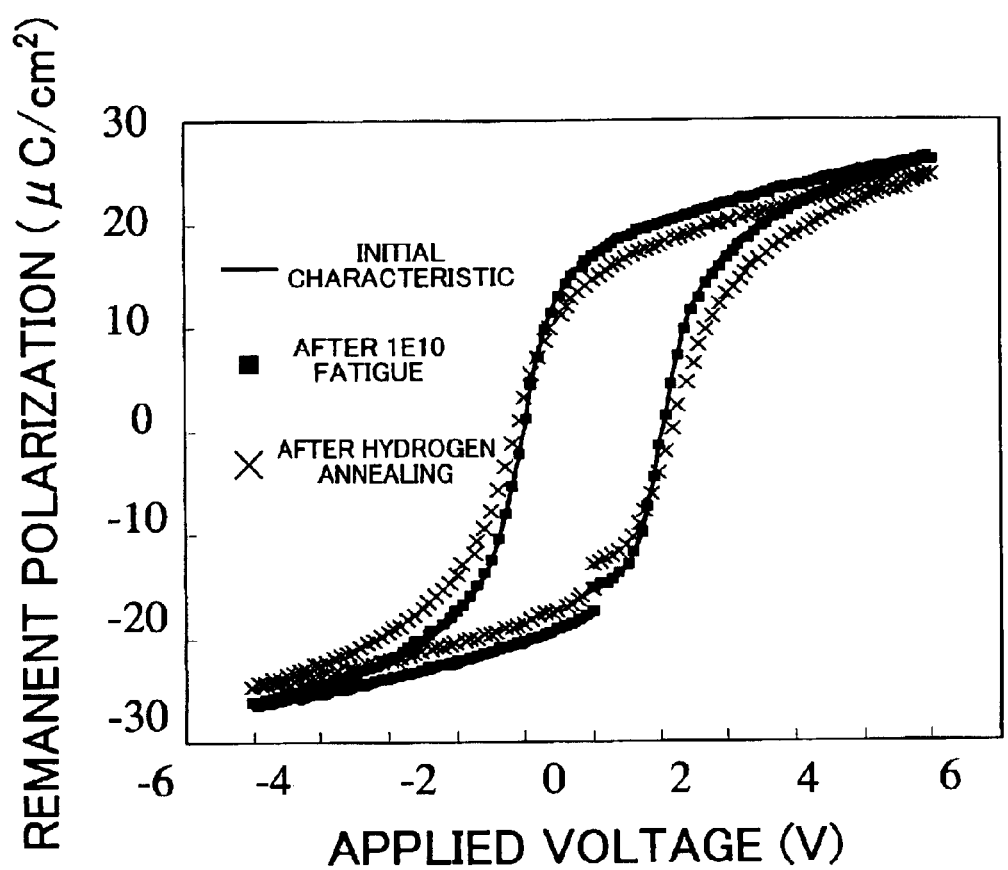
FIG. 24 is a view showing hysteresis of a capacitor in an example of the present invention.

As a result, almost no change was observed as shown in FIG. 24. It is known that ferroelectric crystals are easily reduced by hydrogen ions due to their strong ionic bonding properties. However, reduction resistance was remarkably improved by allowing elements having strong covalent bonding properties such as Si and Ge to be introduced into the ferroelectric crystals.

As described above, the crystallization temperature of the ferroelectric thin film of the present invention is decreased by the catalytic effect of the silicate or germanate which is crystallized at a low temperature. A significant effect is obtained by using only Si (silicate). However, use of Si together with Ge, which has an ionic radius greater than that of Si and easily replaces the B site of the oxygen octahedron in the ferroelectric, is further effective.

What is claimed is:

1. A ferroelectric capacitor, comprising:
   a substrate;
   a first electrode formed above the substrate;
   a film formed on the first electrode;
   a second electrode formed on the film,
   wherein the film comprises a ferroelectric material and a paraelectric material shown by $ABO_x$.

2. The capacitor as defined in claim 1,
   wherein the ferroelectric material includes a PZT-based ferroelectric, and
   wherein the $ABO_x$ includes at least one of Ge and Si in a B site.

3. The capacitor as defined in claim 2,
   wherein the paraelectric material shown by $ABO_x$ includes at least one of Pb, Hf, Zr, V, and W in an A site.

4. The capacitor as defined in claim 1,
   wherein the ferroelectric material includes a layered perovskite ferroelectric, and
   wherein the paraelectric material is shown by $ABO_x$ or $BO_x$ which includes at least one of Ge and Si in a B site.

5. The capacitor as defined in claim 4,
   wherein the paraelectric material shown by $ABO_x$ includes at least one of Bi, Hf, Zr, V, and W in an A site.

6. The capacitor as defined in claim 2,
   wherein the paraelectric material shown by $ABO_x$ includes at least one of Ca, Sr, Ln (Ln is the abbreviation for lanthanoid, Ln: La, Ce, Pr, Nd, Sm, Eu, Gd, Tb, Dy, Ho, Er, Yb, and Lu), Nb, Mn, and Pb in an A site.

7. The capacitor as defined in claim 2,
   wherein the PZT-based ferroelectric has a (111) preferred oriented tetragonal structure.

8. The capacitor as defined in claim 2,
   wherein the PZT-based ferroelectric has a (100) preferred oriented rhombohedral structure.

9. The capacitor as defined in claim 4,
   wherein the layered perovskite ferroelectric is a (115) preferred oriented SBT.

10. The capacitor as defined in claim 4,
    wherein the layered perovskite ferroelectric is a (117) preferred oriented BIT.

11. The capacitor as defined in claim 2,
    wherein the paraelectric material includes at least one of a silicate and a germanate having a relative dielectric constant lower than a relative dielectric constant of a material for the ferroelectric.

12. The capacitor as defined in claim 2,
    wherein a molar ratio of a material B for the paraelectric material to a material A for the ferroelectric material is $0.1 \leq$ the material B/the material A- 9.

13. The capacitor as defined in claim 12,
    wherein the molar ratio of the material B to the material A is $0.1 \leq$ the material B/the material $A \leq 1$.

14. The capacitor as defined in claim 12,
    wherein the molar ratio of the material B to the material A is $1 <$ the material B/the material $A \leq 9$.

15. The capacitor as defined in claim 1,
    wherein the ferroelectric material includes a tungsten-bronze ferroelectric, and
    wherein the paraelectric material is shown by $ABO_x$ or $BO_x$ which includes at least one of Ge and Si in a B site.

16. A method of manufacturing a capacitor, comprising: a step of crystallizing a ceramic raw material liquid including a first raw material liquid and a second raw material liquid, the first raw material liquid being a raw material liquid for forming a ferroelectric material, and the second raw material liquid being a raw material liquid for forming a paraelectric material shown by $ABO_x$.

17. The method of manufacturing the capacitor as defined in claim 16,
    wherein the first raw material liquid is a raw material liquid for forming a PZT-based ferroelectric, and
    wherein the second raw material liquid is a raw material liquid for forming the paraelectric material shown by $ABO_x$ or $BO_x$ which includes at least one of Ge and Si in a B site.

18. The method of manufacturing the capacitor as defined in claim 16,
    wherein the first raw material liquid is a raw material liquid for forming a layered perovskite ferroelectric, and
    wherein the second raw material liquid is a raw material liquid for forming the paraelectric material shown by $ABO_x$ or $BO_x$ which includes at least one of Ge and Si in a B site.

19. The method of manufacturing the capacitor as defined in claim 16,
    wherein the ceramic raw material liquid is formed by mixing the first raw material liquid with the second raw material liquid at a ratio from 100:400 to 100:900 in a liquid state.

20. The method of manufacturing the ferroelectric capacitor as defined in claim 16,
    wherein the first raw material liquid and the second raw material liquid are applied in the form of a mist.

21. The method of manufacturing the capacitor as defined in claim 16, comprising:
    forming a film by crystallizing the ceramic raw material liquid by rapid thermal annealing after applying the ceramic raw material liquid on a first electrode,
    forming a second electrode on the film, and
    performing annealing in a pressurized atmosphere containing oxygen.

22. The method of manufacturing the capacitor as defined in claim 16,
    wherein ultraviolet rays are irradiated when crystallizing the ceramic raw material liquid.

23. A capacitor, comprising:
    a substrate;
    a first electrode formed above the substrate;
    a film formed on the first electrode;
    a second electrode formed on the film,
    wherein the film comprises a ferroelectric material and a paraelectric material, and the paraelectric material includes at least one of a silicate and a germinate having a relative dielectric constant lower than a relative dielectric constant of the ferroelectric material.

24. The capacitor as defined in claim 23, wherein the paraelectric material includes at least one of:

at least one layered compound having an oxygen tetrahedral structure selected from a group consisting of $CaSiO_3$, $BaSiO_3$, $PbSiO_3$, $ZnSiO_3$, $MgSiO_3$, $B_2SiO_5$, $Al_2SiO_5$, $Y_2SiO_5$, $La_2SiO_5$, $Cr_2SiO_5$, $Bi_2SiO_5$, $Ga_2SiO_5$, $ZrSiO_4$, $TiSiO_4$, $HfSiO_4$, $NbSiO_4$, $MoSiO_5$, $WSiO_5$, and $V_2SiO_7$, and at least one layered compound having an oxygen tetrahedral structure selected from a group consisting of $CaGeO_3$, $BaGeO_3$, $PbGeO_3$, $ZnGeO_3$, $MgGeO_3$, $B_2GeO_5$, $Al_2GeO_5$, $Y_2GeO_5$, $La_2GeO_5$, $Cr_2GeO_5$, $Bi_2GeO_5$, $Ga_2GeO_5$, $ZrGeO_4$, $TiGeO_4$, $HfGeO_4$, $NbGeO_4$, $MoGeO_5$, $WGeO_5$, and $V_2GeO_7$.

25. The capacitor as defined in claim 23, wherein a molar ratio of the paraelectric material to the ferroelectric material is 0.1≦the material/the ferroelectric material≦9.

26. The capacitor as defined in claim 25, wherein the molar ratio of the paraelectric material to the ferroelectric material is 0.1≦the material/the ferroelectric material≦1.

27. The capacitor as defined in claim 25, wherein the molar ratio of the paraelectric material to the ferroelectric material is 1<the paraelectric material/the ferroelectric material≦9.

28. The capacitor as defined in claim 4, wherein the paraelectric material shown by $ABO_x$ includes at least one of Ca, Sr, Ln (Ln is the abbreviation for lanthanoid, Ln: La, Ce, Pr, Nd, Sm, Eu, Gd, Tb, Dy, Ho, Er, Yb, and Lu), Nb, Mn, and Pb in an A site.

29. The capacitor as defined in claim 4, wherein the paraelectric material includes at least one of a silicate and a germanate having a relative dielectric constant lower than a relative dielectric constant of a material for the ferroelectric.

30. The capacitor as defined in claim 4, wherein a molar ratio of a material B for the paraelectric material to a material A for the ferroelectric material is 0.1≦the material B/the material A≦9.

31. The capacitor as defined in claim 30, wherein the molar ratio of the material B to the material A is 0.1≦the material B/the material A≦1.

32. The capacitor as defined in claim 30, wherein the molar ratio of the material B to the material A is 1<the material B/the material A≦9.

33. A memory device comprising the capacitor as defined in claim 1.

34. A memory device comprising the capacitor as defined in claim 23.

* * * * *